(12) United States Patent
Utsumi et al.

(10) Patent No.: US 7,038,143 B2
(45) Date of Patent: May 2, 2006

(54) WIRING BOARD, FABRICATION METHOD OF WIRING BOARD, AND SEMICONDUCTOR DEVICE

(75) Inventors: Shigeru Utsumi, Hyogo (JP); Hirofumi Fujioka, Hyogo (JP); Seiji Oka, Hyogo (JP); Hideki Tsuruse, Hyogo (JP); Taichi Kase, Hyogo (JP); Takeshi Muraki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 154 days.

(21) Appl. No.: 10/422,973

(22) Filed: Apr. 25, 2003

(65) Prior Publication Data

US 2003/0213615 A1    Nov. 20, 2003

(30) Foreign Application Priority Data

May 16, 2002 (JP) .............................. 2002-141524
Jan. 6, 2003 (JP) .............................. 2003-000144

(51) Int. Cl.
*H05K 1/00* (2006.01)

(52) U.S. Cl. ...................... 174/258; 174/255; 174/256; 361/313; 29/832

(58) Field of Classification Search ................ 174/257, 174/255, 260, 256; 361/792, 793, 794, 795, 361/303, 305, 313, 321.1
See application file for complete search history.

(56) References Cited

U.S. PATENT DOCUMENTS 3,515,580 A * 6/1970 Eastes ........................ 428/341
4,864,722 A * 9/1989 Lazzarini et al. ............. 29/830
5,079,069 A   1/1992 Howard et al.
5,172,304 A * 12/1992 Ozawa et al. ................ 361/763
5,261,153 A * 11/1993 Lucas .......................... 29/830
2001/0011606 A1   8/2001 Bergstedt

FOREIGN PATENT DOCUMENTS

| JP | 62-210693 | 9/1987 |
| JP | 64-52269(U) | 3/1989 |
| JP | 5-37153 | 2/1993 |
| JP | 9-254308 | 9/1997 |
| JP | 2000-218739 | 8/2000 |
| JP | 2001-77539 | 3/2001 |
| JP | 2002-204073 | 7/2002 |
| WO | WO 91/02647 | 3/1991 |

* cited by examiner

*Primary Examiner*—Kamand Cuneo
*Assistant Examiner*—Ishwar Patel
(74) *Attorney, Agent, or Firm*—Leydig, Voit & Mayer, Ltd.

(57) ABSTRACT

A wiring board includes a first conductor formation substrate having a first substrate and a first electrode; a second conductor formation substrate having a second substrate and a second electrode; and a dielectric sandwiched between the first conductor formation substrate and the second conductor formation substrate. The dielectric includes a dielectric film that is not melted during thermo-compression bonding, and an adherent insulator melted during thermo-compression bonding. The surface of the dielectric film is subjected to a treatment to improve wettability. Adherence of the adherent insulator in thermo-compression bonding to the dielectric film is facilitated. The distance between the first electrode and the second electrode is made uniform by interposing the dielectric film between the first and second electrodes. A wiring board ensured as to lifetime and improved in reliability, and a simple method of fabricating such a wiring board are achieved.

13 Claims, 10 Drawing Sheets

WIRING BOARD, FABRICATION METHOD OF WIRING BOARD, AND SEMICONDUCTOR DEVICE

BACKGROUND OF THE INVENTION

1. Field of the Invention

The present invention relates to a wiring board incorporating the function of a capacitor, an inductor, or both internally, and a method of fabricating such a wiring board. Furthermore, the present invention generally relates to a wiring board, a semiconductor device including a wiring board, and a wiring board fabrication method, more particularly, to a wiring board with a capacitor device, a semiconductor device including such a wiring board, and a method of fabricating such a wiring board.

2. Description of the Background Art

FIG. 27 is a sectional view of a structure of a conventional wiring board. Referring to FIG. 27, a conventional wiring board includes a first conductor formation substrate 104 and a second conductor formation substrate 107. First conductor formation substrate 104 includes a first substrate 102 formed of, for example, epoxy glass base material, and a conductive first electrode 103 formed in plurality on the plane of first substrate 102, and identified as the first conductor. Second conductor formation substrate 107 includes a second substrate 105 formed of, for example, epoxy glass base material, and a conductive second electrode 106 formed in plurality at second substrate 105, and identified as a second conductor. First and second conductor formation substrates 104 and 107 are disposed with first and second electrodes 103 and 106 facing each other. Wiring board 101 includes a dielectric 108 of a dielectric between first and second conductor formation substrates 104 and 107.

The above-described wiring board 101 employs an internal configuration as a parallel-plate capacitor by the arrangement of first and second electrodes 103 and 106 located facing each other with dielectric 108 therebetween within wiring board 101. Accordingly, the area of the capacitor occupying wiring board 101 is reduced to allow a smaller wiring board 101.

Japanese Patent Laying-Open No. 2001-077539 discloses formation of an inductor in a wiring board by mixing powder of high magnetic permeability into a dielectric of the wiring board. In other words, by mixing powder of high magnetic permeability into dielectric 108, an inductor can be formed in wiring board 101 in addition to the capacitor, allowing a further smaller wiring board 101.

A method of fabricating this wiring board 101 will be described with reference to FIGS. 28–30 schematically representing fabrication steps. First, a plurality of first electrodes 103 are formed on first substrate 102 to form first conductor formation substrate 104. Then, a dielectric sheet 109 is disposed at the first electrode 103 side of first conductor formation substrate 104, followed by deposition of a metal foil 110 thereon (FIG. 28). Dielectric sheet 109 is formed of thermosetting epoxy resin that is hardened when first melted at a predetermined temperature and then subjected to higher temperature. The temperature is gradually increased to have dielectric sheet 109 melted while the stacked first conductor formation substrate 104, dielectric sheet 109 and metal foil 110 are sandwiched between stainless steel plates to be compressed in the stacked direction. During this compression process, the pressing force is adjusted so as to obtain a predetermined distance between metal foil 110 and first electrode 103. This adjustment continues until dielectric sheet 109 is hardened. Thus, dielectric sheet 109 is formed as a dielectric 108 in close adherence to first conductor formation substrate 104 and metal foil 110 (FIG. 29). Then, metal foil 110 is etched to form second electrode 106 (FIG. 30). At the final stage, epoxy glass base material, for example, is heated and melted to form second substrate 105 at the second electrode 106 side of dielectric 108. Eventually, wiring board 101 shown in FIG. 27 is fabricated.

In the above-described fabrication method of wiring board 101, compression is applied in the approaching direction between first conductor formation substrate 104 and metal foil 110 while the entire dielectric sheet 109 attains a melting state. This means that dielectric sheet 109 corresponding to the perimeter area of first conductor formation substrate 104 and metal foil 110 may readily flow outside whereas the inner portion of dielectric sheet 109 is less likely to flow out since there is no place to escape. Therefore, the eventual wiring board 101 will exhibit a tendency of dielectric 108 between first electrode 103 and second electrode 106 being thinner at the perimeter area of wiring board 101 thicker inwards. Even if first electrode 103 and second electrode 106 facing each other have the same area, the capacitance as capacitors thereof will differ since the thickness of dielectric 108 differs between the perimeter area and the inner area of wiring board 101. Particularly in the case where the distance between the first and second electrodes 103 and 106 (referred to as "interelectrode distance" hereinafter) is reduced to increase the capacitance of the capacitor, the difference in the inter-electrode distance will greatly affect the capacitance of the capacitor. Thus, there was a problem of increase in the variation of the capacitance at respective sites in wiring board 101 caused by the large difference in the capacitance of the capacitor between the perimeter side region and inner side region of wiring board 101.

Also, shorting will occur between first and second electrodes 103 and 106 in wiring board 101 when there is a foreign object between first electrode 103 and metal foil 110, for example, or when direct contact is established between a first electrode 103 and metal foil 110, inducing the possibility of not being able to function as a capacitor.

Variation in the distance between first and second electrodes 103 and 106 as well as shorting between first and second electrodes 103 and 106 is disadvantageous in that, even in the case where an inductor is formed internally, that inductance will differ greatly between the perimeter side region and inner region of wiring board 101.

In practical applications, the lifetime of a wiring board depends on the occurrence of delamination. The need arises for a wiring board that has occurrence of such delamination suppressed to ensure the lifetime of a wiring board.

Description proceeds to another conventional art. A multilayer printed wiring board aimed to increase the wiring density is fabricated by the so-called build up method. In the fabrication of a multilayer printed wiring board according to the build up method, an insulator layer and conductor layer are sequentially stacked on a core substrate. Electrical connection between these layers is established by forming a hole at appropriate predetermined positions, and filling the hole with conductive resin or apply metal coating. In the method of establishing electrical connection between layers by a through hole, all the conductor layers must be pierced. In contrast, only conductor layers that require electrical connection are to be pierced according to the build up method. Therefore, the wiring density can be increased in a multilayer printed wiring board fabricated by the build up method.

Some multilayer printed wiring boards incorporate a parallel-plate capacitor with an insulator layer identified as a dielectric provided between conductor layers identified as capacitor electrodes facing each other. Such a multilayer printed wiring board incorporating a capacitor is disclosed in International Publication No. WO 91/02647 (U.S. Pat. No. 5,079,069) as a capacitive printed wiring board.

The capacitive printed wiring board disclosed in International Publication No. WO 91/02647 (U.S. Pat. No. 5,079,069) includes a capacitor laminate in the printed wiring board. This capacitor laminate is formed of a pair of conductive sheets provided with a predetermined distance therebetween, and a dielectric sheet provided between the conductive sheets. The conductive sheet is formed of a conductive material, preferably copper. The dielectric sheet is formed of, for example, ceramic filled with epoxy. At the surface of the capacitive printed wiring board is attached a device to which the pair of conductive sheets is connected via a power supply line and a ground line.

Another multilayer printed wiring board incorporating a capacitor is disclosed in Japanese Patent Laying-Open No. 2002-204073 as a multilayer board.

The multilayer board disclosed in Japanese Patent Laying-Open No. 2002-204073 includes a film having circuitry formed at the surface, a fiber reinforced resin layer provided at both sides of the film, and an outermost layer circuit provided above the fiber reinforced resin layer. For the purpose of forming a capacitor circuit at the film, the film includes the mixture inorganic powder having a high dielectric constant such as lead zirconate titanate (PZT). By using a thin film of constant thickness, the capacitance of the capacitor can be maintained at a high and constant level.

The capacitive printed wiring board disclosed in International Publication No. WO 91/02647 (U.S. Pat. No. 5,079,069) employs epoxy that is thermosetting resin for the dielectric sheet that functions as the dielectric of a capacitor laminate. In the fabrication of a capacitor laminate, epoxy in a fluidized state is disposed between the pair of conductive sheets. The pair of conductive sheets is pressed together until the distance between the conductive sheets attains a predetermined value. Then, the epoxy is heated to be cured, whereby a capacitor laminate is completed.

It is difficult to precisely control the distance between the conductive sheets under a state where epoxy is disposed in a fluidized state. Specifically, when pressing is applied on the pair of conductive sheets, excessive epoxy located between the pair of conductive sheets will move from the center area to the perimeter area of the conductive sheet to be forced outside. The conductive sheet has a tendency of being thick at the center region and thinner towards the perimeter region. It is to be noted that the capacitive density of a capacitor depends on the distance between the pair of conductive sheets and the dielectric constant of the dielectric sheet. If the distance between the pair of conductive sheets cannot be precisely controlled, problems such as disallowing formation of a capacitor at the desired capacitive density or variation in the capacitive density of the capacitor will occur.

In order to increase the capacitive density of the capacitor, the distance between the pair of conductive sheets must be set small. However, there is a possibility of the distance between the conductive sheets being smaller than the predetermined distance since it is difficult to precisely control the distance between the pair of conductive sheets. In such cases, defects such as a pinhole, crack or void may be generated at the dielectric sheet corresponding to such close area. There is also a possibility of shorting occurring between the conductive sheets. Such problem are particularly noticeable at the perimeter region of the conductive sheet due to the smaller film thickness thereof. Sufficient breakdown voltage of a capacitor cannot be ensured.

In the multilayer board disclosed in Japanese Patent Laying-Open No. 2002-204073, the film has inorganic powder of high dielectric constant included to form a capacitor circuit. Such inorganic powder of high dielectric constant is generally added to epoxy resin or the like and applied to the film in a fluidized state. Therefore, there is a possibility of the aforementioned problem being induced.

SUMMARY OF THE INVENTION

In view of the foregoing, an object of the present invention is to provide a wiring board with a constant internal inter-electrode distance to obviate shorting between first and second electrodes, and having occurrence of internal delamination suppressed to ensure the lifetime and improve reliability, and a fabrication method of such a wiring board.

Another object of the present invention is to provide a wiring board incorporating a capacitor formed with a capacitive density of stable and desirable level and that can reliably prevent shorting between facing electrodes, a semiconductor device including such a wiring board, and a fabrication method of such a wiring board.

According to an aspect of the present invention, a wiring board includes a first conductor formation substrate having a first substrate, and a plurality of first conductors formed on the plane of the first substrate spaced apart; a second conductor formation substrate having a second substrate, and a plurality of second conductors formed at the second substrate, the second conductor disposed facing the first conductor; and a dielectric interposed between the first conductor formation substrate and the second conductor formation substrate. At least the dielectric is formed by thermo-compression bonding. The dielectric includes an adherent insulator having a melting point lower than the temperature reached during thermo-compression bonding and rendered molten during thermo-compression bonding; and a dielectric film interposed between the first conductor and the second conductor. The surface of the dielectric film is subjected to a treatment that improves wettability with the molten adherent insulator. The dielectric film has a melting point higher than the temperature reached during thermo-compression bonding.

According to another aspect of the present invention, a wiring board includes first and second conductor-films facing each other, a first dielectric film provided between and in contact with at least one of the first and second conductor films, and a second dielectric film between the first and second conductor films, and attaining a solidified state in a condition under which the first dielectric film has flowability. The first and second dielectric films meet the relationship of $0 < T1/(T1+T2) \leq 0.4$, where $T1$ is the thickness of the first dielectric film and $T2$ is the thickness of the second dielectric film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
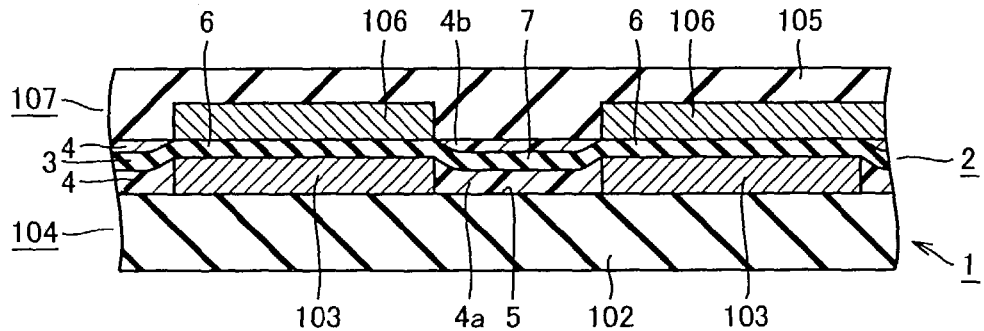
FIG. 1 is a sectional view of a wiring board according to a first embodiment of the present invention.

Embodiments of the present invention will be described hereinafter with reference to the drawings. The same or corresponding members and elements corresponding to those of conventional art have the same reference characters allotted.

First Embodiment

Referring to FIG. 1, a wiring board 1 according to a first embodiment of the present invention includes a first conductor formation substrate 104 and a second conductor formation substrate 107. First conductor formation substrate 104 includes a first substrate 102 formed of, for example, epoxy glass base material, and a plate-like first electrode 103 identified as the first conductor formed on the plane of first substrate 102. Second conductor formation substrate 107 includes a second substrate 105 formed of, for example, epoxy glass base material, and a plurality of plate-like second electrodes 106 identified as a second conductor at second substrate 105. First conductor formation substrate 104 and second conductor formation substrate 107 are arranged with first electrode 103 and second electrode 106 facing each other. Wiring board 1 further includes a dielectric 2 of a dielectric material interposed between first and second conductor formation substrates 104 and 107. Dielectric 2 includes a dielectric film 3 and an adherent insulator 4 having different melting points.

First electrode 103 on first conductor formation substrate 104 has a thickness of, for example, 18 μm, and is formed on the plane of first substrate 102 protruding by the corresponding thickness of 18 μm. First electrode 103 is formed in plurality, spaced apart. A concave portion 5 is formed between respective first electrodes 103.

Second electrode 106 in second conductor formation substrate 107 has a thickness of, for example, 18 μm, and is buried in second substrate 105 with the plane at the first conductor formation substrate 104 side exposed.

Dielectric film 3 is, for example, a polyphenylene sulfide film having a constant thickness of 6 μm, for example, and a relative permittivity 3. Dielectric film 3 is formed of an inter-electrode portion 6 between first and second electrodes 103 and 106, and a bridge portion 7 provided between respective inter-electrode portions 6. Dielectric film 3 is flexible, and has bridge portion 7 sagging towards concave portion 5. The surface of dielectric film 3 in contact with adherent insulator 4 is subjected to, for example, a corona discharge treatment.

Adherent insulator 4 includes a first adherent insulator 4a provided at the first conductor formation substrate 104 side of dielectric film 3, and a second adherent insulator 4b provided at the second conductor formation substrate 107 side of dielectric film 3. The material of adherent insulator 4 is thermosetting epoxy resin that is cured at approximately 180° C. Adherent insulator 4 provides adherence between dielectric film 3 and first conductor formation substrate 104 as well as between dielectric film 3 and second conductor formation substrate 107. First adherent insulator 4a occupies the space between bridge portion 7 and concave portion 5. First adherent insulator 4a is interposed between first electrode 103 and inter-electrode portion 6, thin enough so as not to affect the inter-electrode distance, to provide adherence between dielectric film 3 and first conductor formation substrate 104. Second adherent insulator 4b occupies the space between sagging bridge portion 7 and second substrate 105. Second adherent insulator 4b is interposed between second electrode 106 and inter-electrode portion 6, thin enough so as not to affect the inter-electrode distance, to provide adherence between dielectric film 3 and second conductor formation substrate 107.

In wiring board 1 of the above structure, inter-electrode portion 6 having a constant thickness is located between first and second electrodes 103, 206. Also, adherent insulator 4 located between first and second electrodes 103 and 106 is set thin enough so as to avoid influencing the inter-electrode distance. Therefore, the inter-electrode distance is determined by the thickness of inter-electrode portion 6. Accordingly, the inter-electrode distance will not greatly differ by site, as compared to the conventional one. As a result, variation in the capacitance of the capacitor formed therein can be suppressed.

In general, adherence between dielectric film 3 and adherent insulation film 4 formed of different materials is not readily achieved. In the present embodiment, the surface of dielectric film 3 is subjected to a corona discharge treatment, for example, whereby the adherence between dielectric film 3 and adherent insulator 4 is improved. Therefore, delamination will not easily occur.

Figure 2:
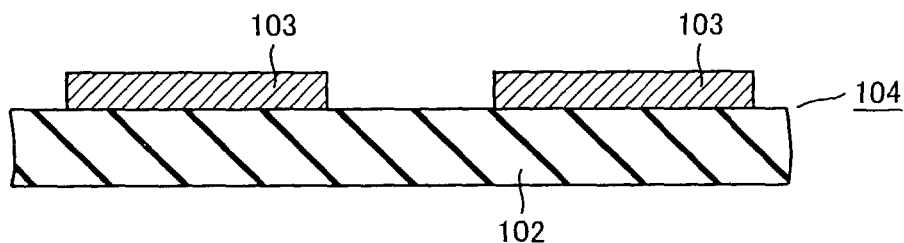
FIG. 2 is a schematic diagram of a wiring board after a first conductor formation substrate step.
Figure 3:
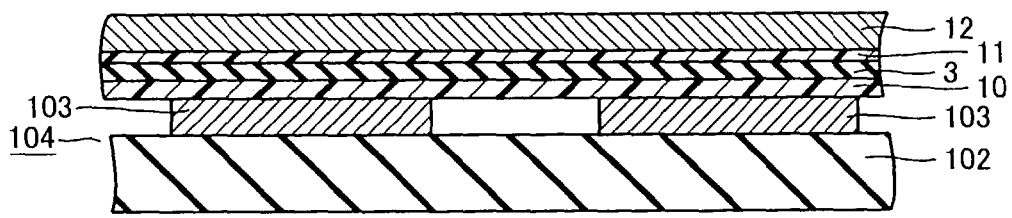
FIG. 3 is a schematic diagram of a wiring board after a first insulation film stacking step, a dielectric film processing step, a dielectric film stacking step, a second insulation film stacking step, and a conductor film stacking step.

A method of fabricating such a wiring board 1 will be described with reference to FIGS. 2–5. On first substrate 102 corresponding to a plane of, for example, 340 mm×340 mm, a plurality of first electrodes 103 (784) having a thickness of 18 μm, for example, are arranged in matrix for every 10 mm, likewise the conventional manner, excluding the region of 30 mm of the perimeter of the plane of first substrate 102 to form first conductor formation substrate 104 (first conductor formation substrate step; FIG. 2). Then, a first adherent insulation film 10 identified as an insulation film for adhesion formed of thermosetting epoxy resin having a melt viscosity of 105 p at approximately 150° C. and cured at approximately 180° C. is disposed at the side of first electrode 103 of first conductor formation substrate 104 (first insulation film stacking layer). Dielectric film 3 is stacked on this first adherent insulation film 10 (dielectric film stacking step). Prior to the dielectric film stacking process, the surface of dielectric film 3 is subjected to a corona discharge treatment to have the wettability with the molten adherent insulation film improved. This treatment to improve wettability may be an ozone treatment or an oxygen plasma treatment (dielectric film processing step). Next, a second adherent insulation film 11 that is an insulation film for adherence of a material identical to that of first adherent insulation film 10 is stacked thereon (second insulation film stacking processing step). The thickness of first adherent insulation film 10 is set to 10 μm, for example, smaller than the thickness of first electrode 103. The thickness of second adherent insulation film 11 is set to 5 μm, for example. The thickness of dielectric film 3 is set to the aforementioned 6 μm, for example. Then, a conductor film 12 having conductivity that is a copper foil of 18 μm in thickness, for example, is stacked on second adherent insulation film 11 (conductor film stacking step). Thus, the state shown in FIG. 3 is achieved.

Then, first conductor formation substrate 104, first adherent insulation film 10, dielectric film 3, second adherent insulation film 11 and conductor film 12 are pressed towards each other from the first conductor formation substrate 104 side and the conductor film 12 side, sandwiched between stainless steel plates identified as pressure plates. During this compression bonding process, the temperature is raised at the rate of 6° C./min. up to approximately 180 ° C., the temperature where the thermosetting epoxy resin is cured (thermo-compression bonding). Dielectric film 3 is formed of a flexible material that does not melt even at the highest temperature attained in this thermo-compression bonding step. For example, dielectric film 3 is formed of polyphenylene sulfide that does not melt even at the temperature of approximately 180° C. where the adherent insulation film is cured. It is to be noted that first adherent insulation film 10 and second adherent insulation film are formed of thermosetting epoxy resin that is melted and cured at the thermo-compression bonding step. Therefore, as the temperature rises in the thermo-compression bonding step, only first and second adherent insulation films 10 and 11 melt.

Since first electrode 3 is formed protruding from first substrate 102 by its thickness, the pressing force through the stainless steel plates is directly exerted on first adherent insulation film 10, dielectric film 3, and second adherent insulation film 11 disposed between first electrode 103 and conductor film 12. This pressing force causes first and second adherent insulation films 10 and 11, when melted by the rise in temperature, to be extruded out from the region between first electrode 103 and conductor film 12. At this stage, first adherent insulation film 10 flows into concave portion 5 whereas second adherent insulation film 11 flows into the gap formed by dielectric film 3 sagging in response to the extruding force. Then, first and second adherent insulation films 10 and 11 are heated up to the temperature of approximately 180° C. to be cured. Thus, first adherent insulation film 10 is formed as first adherent insulator 4a whereas second adherent insulation film 11 is formed as second adherent insulator 4b. In order to achieve this flow-in space, the total thickness of first and second adherent insulation films 10 and 11 is set smaller than the thickness of first electrode 103, i.e., smaller than the depth of concave portion 5. In other words, the total thickness of first and second adherent insulation films 10 and 11 is set smaller than the thickness of first electrode 103 corresponding to the increased thickness caused by first adherent insulation film 10 flowing into concave portion 5 and second adherent insulation film 11 flowing into the space formed by the sagging dielectric film 3. In the case where the occupying area of first electrode 103 on the plane of first substrate 102 is large, the total thickness of first and second adherent insulation films 10 and 11 must be set drastically larger than the thickness of first electrode 103. In contrast, when the occupying area is small, the difference in thickness must be set small. It is to be noted that dielectric film 3 will sag greater as second adherent insulation film 11 becomes thicker, resulting in load on dielectric film 3 to cause the possibility of affecting the lifetime or the like. Therefore, second adherent insulation film 11 is set to an appropriate thickness that will avoid large sagging of dielectric film 3. First and second adherent insulation films 10 and 11 are not completely extruded out from the region between first electrode 103 and conductor film 12. An extremely thin layer required for adhesion remains.

Figure 4:
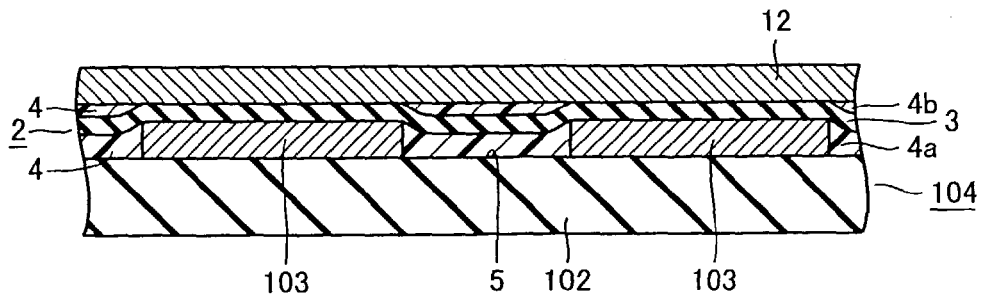
FIG. 4 is a schematic diagram of a wring board after a thermo-compression bonding step.

Dielectric film 3 does not melt in the thermo-compression bonding step. Therefore, dielectric film 3 remains as inter-electrode portion 6 with a constant thickness between first electrode 103 and conductor film 12, and also as bridge portion 7 sagging by the pressure of molten second adherent insulation film 11, between respective inter-electrode portions 6. Thus, the state shown in FIG. 4 is achieved.

Figure 5:
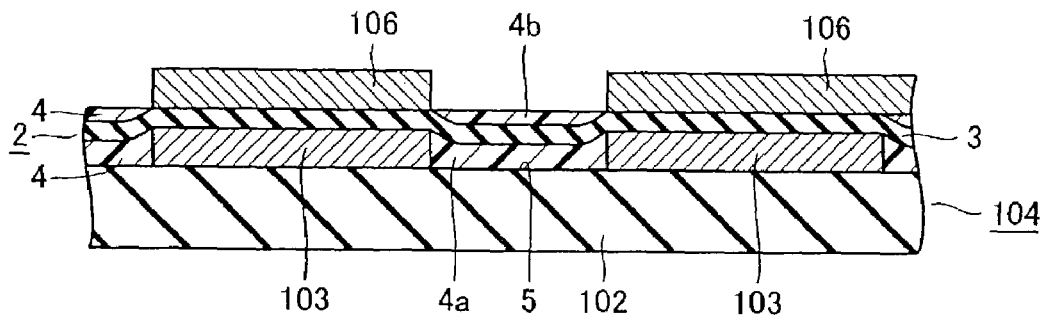
FIG. 5 is a schematic diagram of a wiring board after a second conductor formation step.

Then, conductor film 12 is etched to form second electrode 106 remaining at an appropriate site corresponding to first electrode 103 (second conductor formation step). Thus, the state shown in FIG. 5 is achieved. Finally, second substrate 105 is formed in a conventional manner at the second electrode 106 side of dielectric film 3. Second conductor formation substrate 107 is provided (second conductor formation substrate step). Thus, wiring board 1 of FIG. 1 is fabricated.

Wiring board 1 of the above structure can be readily fabricated. Wiring substrate 1 of the above structure is further advantageous in that the possibility of shorting between first and second electrodes 103 and 106 is significantly reduced if there is an intrusion of a foreign object between first and second electrodes 103 and 106.

In the first conductor formation substrate step and conductor film stacking step, the material of first electrode 103 and conductor film 12 is not limited to the aforementioned copper, and may include other metals such as zinc, nickel, gold, silver, aluminum or an alloy thereof, or a conductive polymer such as polythiophene, as long as the material has conductivity. Also, the method of forming first electrode 103 and conductor film 12 is arbitrary such as vapor phase deposition, or applying and baking conductive paste.

The material of dielectric film 3 is to be a type that does not melt and decompose in the thermo-compression bonding process, and is not limited to polyphenylene sulfide. For example, polyphenyl sulfone, polyimide, polyethermide, polyphenyl oxide, polyamide, polycarbonate, polyester, polyvinyl chloride, polysilane, polyethylether ketone, acetate, polypropylene, and the like can be employed.

When the Young's modulus is reduced at the temperature of the thermo-compression bonding step, dielectric film 3 will becomes easily deformable by the pressing force to directly affect the inter-electrode distance. Therefore, it is desirable that dielectric film 3 has a Young's modulus that does not have the thickness easily altered by the pressing force even at the temperature reached during the thermo-compression bonding step. For example, the Young's modulus is preferably at least 1 GPa.

When dielectric film 3 is formed having powder of a dielectric constant higher than that of the parent material such as barium titanate powder tempered 20%, for example, with the aforementioned parent material of polyphenylene sulfide powder, the dielectric constant of dielectric 2 in the completed wiring board 1 is further raised to increase the capacitance of the internal capacitor. The blending ratio of power into dielectric film 3 can be altered to adjust the capacitive density of the internal capacitor. The tempered power is not limited to barium titanate, and may be an inorganic crystal of the perovskite structure.

First substrate 102 is not limited to epoxy glass base material, and may employ glass bis maleimide triazine, glass polyphenylene oxide, polyimide, paper based phenolic resin, alumina, or the like.

Since only the region between first and second electrodes 103 and 106 facing each other functions as the internal capacitor, conductor film 12 facing concave portion 5 between respective first electrodes 103 may be left or removed in the second conductor formation step.

In the thermo-compression bonding step, an arbitrary process such as vacuum heat pressing or laminating may be employed as long as first and second adherent insulation films 10 and 11 are melted, and first conductor formation substrate 104, dielectric film 3 and conductor film 12 are thermo-compression bonded.

The order of each of the steps are arbitrary as long wiring substrate 1 can be formed. For example, the first insulation film stacking step may be carried out after the dielectric film stacking step and second insulation film stacking step.

The internal capacitor of wiring board 1 had the capacitive density of 4.3 (pF/mm$^2$) in average at 1 kHz, which is close to the logic value, and the standard deviation of the capacitive density was 0.2 (pF/mm$^2$). As a comparative example, a wiring board 101 having dielectric 108 formed by fusion of dielectric sheet 109 according to a conventional method resulted in 21 first electrodes 103 out of the 784 first electrodes 103 short-circuiting with second electrode 106, not functioning as a capacitor. The remaining internal capacitors had the capacitive density of 4.0 (pF/mm$^2$) in average at 1 kHz, and the standard deviation of this capacitive density was 2.3 (pF/mm$^2$). It was therefore confirmed that wiring board 1 reliably had internal capacitors formed with their capacitance closer to the desired value than in the conventional case. Also, it was confirmed that variation in the capacitive density of the internal capacitor of wiring board 1 was smaller than that of a conventional one.

Wiring board 1 of the first embodiment was left for 500 hours or 1000 hours in an environment of the atmospheric temperature of 30° C., and the relative humidity of 70%. In view of a fictitious state of soldering, wiring substrate 1 was dipped for 10 seconds in a solder bath of 280° C. to examine the effect of adherent insulator 4 formed by fusion of the insulation film on wiring board 1. As a comparative example, a wiring board of a structure similar to that of wiring board 1 of the first embodiment provided that dielectric film 3 is not subjected to a surface treatment was employed.

In a shelf test of 500 hours, no delamination was identified in any of the wiring boards. In the shelf test of 1000 hours, no delamination was identified in wiring board 1 of the first embodiment, i.e., wiring board having dielectric film 3 subjected to a surface treatment. However, delamination was identified between dielectric film 3 and adherent insulator 4 in the wiring board of the comparative example. It was therefore confirmed that applying a surface treatment such as a corona discharge treatment, ozone treatment or oxygen plasma treatment in the dielectric film processing step is advantageous in that the adherence between dielectric film 3 and adherent insulation film 4 is improved. It was confirmed that the reliability of the completed wiring board is improved.

Second Embodiment

Figure 6:
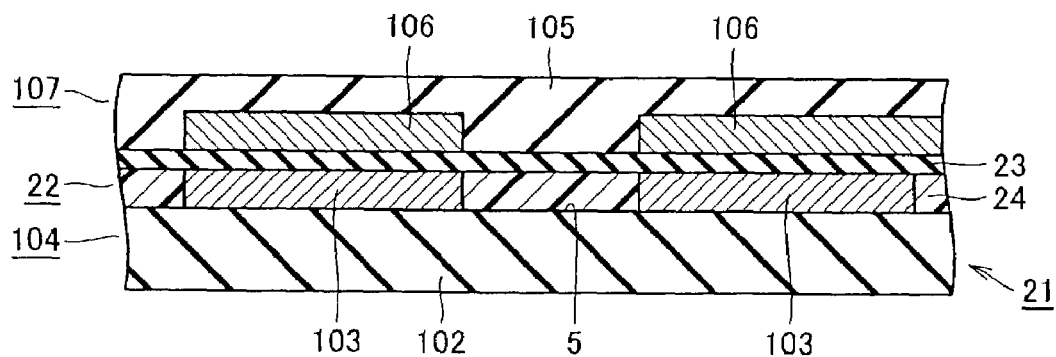
FIGS. 6 and 7 are sectional views of a wiring board according to a second embodiment and a third embodiment, respectively, of the present invention.

Referring to FIG. 6, a wiring board 21 according to a second embodiment of the present invention includes a dielectric 22 between first and second conductive formation substrates 104 and 107. Dielectric 22 includes a dielectric film 23 interposed between first and second conductor formation substrates 104 and 107, and an adherent insulator 24 present only between dielectric film 23 and first conductor formation substrate 104. Adherent insulator 24 is formed of a material identical to that of adherent insulator 4 of the first embodiment. Adherent insulator 24 occupies the space formed between dielectric film 23 and concave portion 5. Adherent insulator 24 is disposed between first electrode 103 and dielectric film 23, thin enough to avoid any effect on the inter-electrode distance, and provides adherence between dielectric film 23 and first conductor formation substrate 104. Specifically, wiring board 21 has a structure corresponding to the structure of wiring board 1 of the first embodiment, provided that a dielectric 22 lacks second adherent insulator 4b of wiring board 1. Dielectric film 23 has its surface at the adherent insulator 24 side subjected to a corona discharge treatment, for example, similar to the surface at the second electrode 106 side.

The remaining structure is similar to that of the first embodiment. Wiring board 21 of such a structure provides advantages similar to those of the first embodiment. Additionally, the load caused by sagging of dielectric film 23 is reduced since the sagging of dielectric film 23 is eliminated. Therefore, the lifetime of wiring board 21 is increased.

Furthermore, since the surface of dielectric film 23 is subjected to a corona discharge treatment, for example, the adhesion between dielectric film 23 and adherent insulation film 24 as well as between dielectric film 23 and second electrode 106 is improved. Thus, the reliability of wiring board 21 is improved.

A method of fabricating such a wiring board 21 will be described here. Similar to the first embodiment, an adherent insulation film similar to first adherent insulation film 10 is stacked on first conductor formation substrate 104 through the first conductor substrate formation step and first insulation film stacking step. The thickness of this adherent insulation film is set smaller than the thickness of first electrode 103 corresponding to the amount flowing to concave portion 5 in a subsequent thermo-compression bonding step. Dielectric film 23 of 6 μm, for example, in thickness formed of a material similar to that of dielectric film 3 has the surfaces of both sides subjected to a corona discharge treatment, for example, (dielectric film processing step) in advance. One of the side surfaces of dielectric film 23 has a conductor film of 18 μm in thickness similar to conductor film 12 of FIG. 3 vapor-deposited. In this step, a conductor film can be formed by electroplating after the vapor-deposition step to adjust the thickness of the conductor film (conductor film stacking process). Dielectric film 23 having this conductor film stacked thereon is placed with the other side face over the adherent insulation film on first conductor formation substrate 104 (dielectric film stacking process). Then, a thermo-compression bonding step similar to that of the first embodiment is conducted. Accordingly, the adherent insulation film is extruded out from the region between first electrode 103 and the conductor film to form adherent insulator 24. Adherent insulator 24 and dielectric film 23 constitute dielectric 22.

Then, the second conductor formation step and second conductor formation substrate step are conducted, likewise the first embodiment, to fabricate wiring board 21.

Although both side surfaces of dielectric film 23 are subjected to a corona discharge treatment in the dielectric film processing step, an ozone treatment or an oxygen plasma treatment may be applied instead, likewise the first embodiment. Furthermore, the surface treatment may differ between one side plane and the other side plane. For example, one side plane of dielectric film 23 may be subjected to a corona discharge treatment whereas the other side plane is subjected to an ozone treatment.

In the conductor film stacking process, the conductor film may be formed by vapor-deposition of nickel, zinc or chromium, instead of copper. Alternatively, the conductor film may be formed by printing using a conductive polymer or conductive paste such as polythiophene dissolved in a solvent. It is desirable that the conductor film is formed of a material that can be readily etched in the second conductor formation step. For example, a substrate with copper, nickel, or zinc as the main component is preferable.

In order to confirm the improvement of the adherence of dielectric film 23 to the conductor film and adherent insulator 24 by the surface treatment in the dielectric film processing step, wiring board 21 was left for 500 hours or 1000 hours in an environment of the atmospheric temperature of 30° C. and the relative humidity of 70%, likewise the first embodiment. In view of a fictitious state of soldering, wiring board 21 was dipped for 10 seconds in a solder bath of 280° C. to identify delamination in wiring board 21.

No delamination was identified in wiring board 21 in the shelf tests of 500 hours and 1000 hours. It was therefore confirmed that the surface treatment of a corona discharge treatment, ozone treatment or oxygen plasma treatment in the dielectric film processing step is advantageous in that, not only the adherence between dielectric film 23 and adherent insulation film 24, but also the adherence between dielectric film 23 and the conductor film is improved. It was confirmed that the reliability of wiring board 21 is improved.

Third Embodiment

Figure 7:
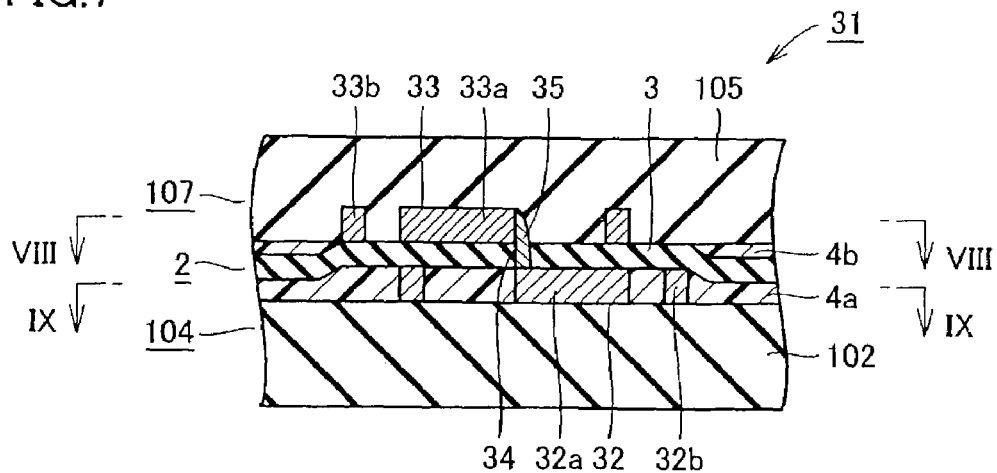
Figure 8:
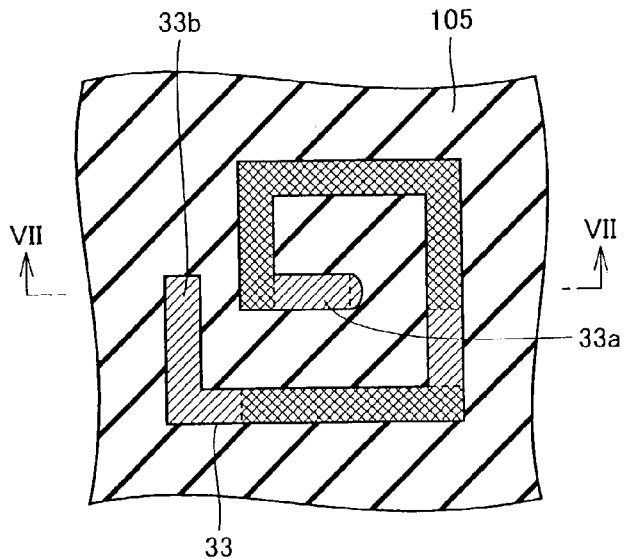
FIGS. 8 and 9 are sectional views of the wiring board of FIG. 7 in the direction of arrow VIII—VIII and arrow IX—IX, respectively.
Figure 9:
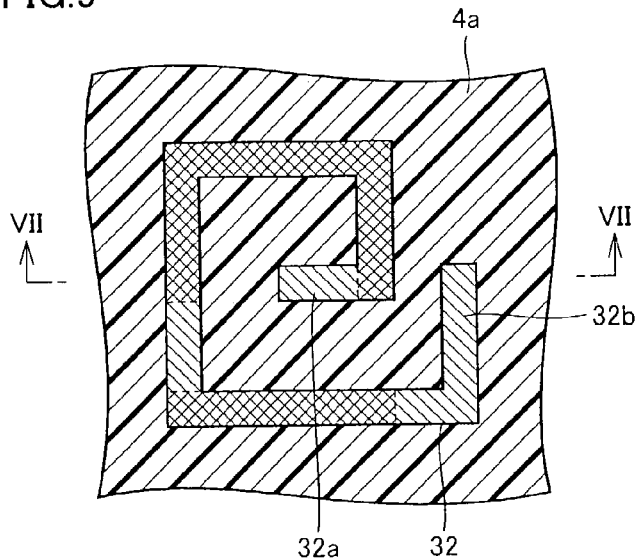

FIG. 7 shows a sectional view of a wiring board 31 according to a third embodiment of the present invention in the direction of arrow VII—VII of FIGS. 8 and 9. Wiring board 31 includes a first conductor line 32 identified as a first conductor and a second conductor line 33 identified as a second conductor, partially facing each other with dielectric 2 therebetween. First and second conductor lines 32 and 33 are formed of a material identical to that of first and second electrodes 103 and 106 of the first embodiment. As shown in FIGS. 8 and 9, first and second conductor lines 32 and 33 are formed in an eddy manner extending from respective inner side end portions 32a and 33a towards outer side end portions 32b and 33b, respectively, counterclockwise to each other. In dielectric 2, a through hole 34 is formed extending from inner side end 32a of first conductor line 32 to inner side end 33a of second conductor line 33. In through hole 34 is formed an electrical connection 35, copper-plated from inner side end 32a to inner side end 33a. Accordingly, electrical connection is established between the first and second conductor lines 32 and 33. In FIGS. 8 and 9, the portion of first and second conductor lines 32 and 33 facing each other with dielectric 2 therebetween is represented by a netted pattern.

The remaining structure is similar to that of the first embodiment.

Wiring board 31 of the above structure provides advantages similar to those of the first embodiment. Since first and second conductor lines 32 and 33 are electrically connected through electrical connection 35 so the winding direction is identical, a spiral inductor can be formed inside by first conductor line 32, second conductor line 33 and the electrical connection 35. Accordingly, the area of the inductor arranged on wiring board 31 can be reduced correspondingly. Also, since the distance between first and second conductor lines 32 and 33 is determined by the thickness of dielectric film 3, great difference in the inductance of the internal inductor depending on site can be suppressed.

Figure 10:
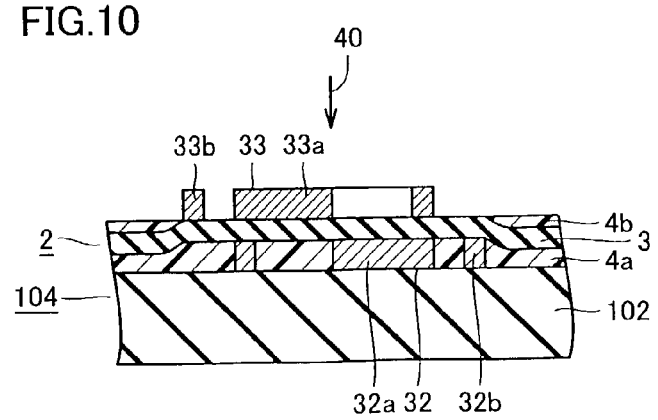
FIG. 10 is a schematic diagram of a wiring board prior to a through hole formation step.

A method of fabricating wiring board 31 will be described here. The fabrication method of wiring board 31 is substantially similar to the first embodiment up to the steps preceding the second conductor formation substrate step. The fabrication method differs from the first embodiment in that the first conductor is formed as first conductor line 32 instead of first electrode 103 in the first conductor formation substrate step, and the second conductor is formed by etching as second conductor line 33 instead of second electrode 106 in the second conductor formation step. Thus, fabrication steps substantially similar to those of the first embodiment are carried out to achieve the state as shown in FIG. 10, preceding the second conductor formation substrate step. Then, carbon dioxide gas laser, for example, is emitted from the direction of the second conductor line 33 side of dielectric 2 towards first conductor line 32, i.e., towards the direction of arrow 40, to form a through hole 34 in dielectric 2. The carbon dioxide gas laser is directed along a path forming contact with inner side end 33a of second conductor line 33 and strike inner side end 32a of first conductor line 32 via dielectric 2 (through hole formation step). Then, through hole 34 formed in the through hole formation step, inner side end 32a and inner end 33a are subjected to chemical copper-plating to form electrical connection 35 that provides electrical connection between first and second conductor lines 32 and 33 (electrical connecting step).

Then, a second conductor formation substrate step similar to that of the first embodiment is carried out. Thus, wiring board 31 is completed.

The internal inductor of wiring board 31 of the present embodiment has an inductance of 6.3 (nH) in average at 1 (kHz) with an inductance standard deviation of 0.17 (nH). As a comparative example, a wiring board fabricated in a manner similar to that of the third embodiment, provided that dielectric 108 is formed with molten dielectric sheet 109 by the conventional method, was employed. The internal inductor of the comparative example had an inductance of 2.1 (nH) in average at 1 (kHz) with an inductance standard deviation of 1.9 (nH). It was therefore confirmed that an internal inductor is formed reliably, likewise an internal capacitor, as compared to the conventional case. Variation in the inductance was smaller than that of the conventional one.

In the through hole formation step, usage of carbon dioxide gas laser is merely exemplary for formation of through hole 34. For example, excimer laser, YAG laser, or a drill can be employed as long as through hole 34 is formed.

In the electrical connection step, formation of electrical connection 35 is not limited to the usage of chemical copper-plating in through hole 34. For example, through hole 34 may be filled with the aforementioned conductive polymer. Alternatively, zinc, nickel, or the like may be plated. Furthermore, electroplating may be carried out after chemical plating to increase the thickness of the plated layer.

In the case where dielectric film 3 is formed by having 20%, for example, of powder with a magnetic permeability higher than that of the parent material, such as powder of Ni—Zn based ferrite tempered with the parent material such as of polyphenylene sulfide, likewise the first embodiment, the magnetic permeability of dielectric 2 becomes higher to increase the inductance of the internal inductor. Also, by disposing the powder in the neighborhood of first and second conductor lines 32 and 33 in dielectric 2, the inductance of the internal inductor can be further increased. The level of the inductance in the internal inductor can be adjusted by altering the mixing ratio or disposed position of powder of a material having high magnetic permeability to dielectric film 3. The powder to be tempered is not limited to Ni—Zn based ferrite. Permalloy, Mn—Zn based ferrite or carbonyl iron and the like may be employed.

The mechanism of forming through hole 34 in the through hole formation step will be described here. When carbon dioxide gas laser or the like is emitted to dielectric 2, the energy thereof mainly passes through dielectric 2 while a portion thereof is absorbed by dielectric 2. The energy through dielectric 2 arrives at inner side end 32a of first conductor line 32. Inner side end 32a absorbs the energy of the carbon dioxide gas laser to exhibit increase in temperature. By this temperature rise, dielectric 2 in close contact to inner side end 32a melts and vaporizes to form through hole 34. Therefore, through hole 34 is formed more quickly as a function of the rate of increase in temperature of inner side end 32a. This means that though hole 34 can be formed quicker if inner side end 32a can absorb the energy of the carbon dioxide gas laser efficiently.

To this end, the surface of the first conductor line 32 is treated so as to absorb the energy of the carbon dioxide gas laser more efficiently after the first conductor formation substrate step. For example, an organic acid treatment of immersing the surface of first conductor line 32 in an organic acid such as acetic anhydride is applied (first conductor processing step). Accordingly, the reflectance at the surface of first conductor line 32 is reduced to improve the absorption of carbon dioxide gas laser energy. The reflectance at the surface of first conductor line 32 may also be reduced by applying an alkaline treatment of immersing the surface of first conductor line 32 in a solution of sodium hydroxide or potassium hydroxide, for example. In practice, the reflectance at the surface of first conductor line 32 with respect to carbon dioxide gas laser could be reduced to 20% or below by the process of an organic acid treatment or alkaline treatment.

In practice, the pulse of the carbon dioxide gas laser is applied towards dielectric 2 to form through hole 34. The formation speed of through hole 34 was compared between one employing first conductor line 32 not subjected to surface treatment and one employing first conductor line 32 having the surface subjected to an organic acid treatment or alkaline treatment by identifying the number of pulses before formation of through hole 34. The number of pulses until formation of through hole 34 was 7 for one employing first conductor line 32 not subjected to a surface treatment and 1 for one employing first conductor film 32 having its surface subjected to an organic acid treatment or alkaline treatment, respectively.

By incorporating a first conductor processing step in the fabrication step of wiring board 31, through hole 34 can be readily formed in dielectric 2. The fabrication time required for wiring board 31 becomes shorter. Also, the load of a laser apparatus generating carbon dioxide gas laser is reduced to allow increase of the lifetime of the apparatus.

The organic acid treatment or alkaline treatment allows the reflectance to be reduced effectively even for the excimer laser or YAG laser. Any process that reduces the reflectance with respect to the laser emitted for the formation of through hole 34 can be employed. The surface treatment of first conductor line 32 is not limited to the aforementioned organic acid treatment or alkaline treatment. For example, the process of applying ink mixed with carbon filler, for example, to the surface of first conductor line 32 may be employed.

In the third embodiment, wiring board 31 including an internal inductor is fabricated based on the fabrication method of wiring board 1 of the first embodiment including second adherent insulator 4b. It is to be understood that a wiring board including an internal inductor may be fabricated based on the fabrication method of wiring board 21 of the second embodiment absent of second adherent insulator 4b.

Furthermore, the wring board may have the internal capacitor and internal inductor formed in the same layer at the same time. In this case, addition of powder of high magnetic permeability and powder of high dielectric constant both into the parent material of dielectric film 3 allows increase of the capacitive density by the powder of high dielectric constant in the area where the internal capacitor is formed and increase of the inductance density by the power of high magnetic permeability in the area where the internal inductor is formed.

Since an internal capacitor and an internal inductor are formed in one wiring board, the internal inductor, for example, can be electrically connected to the internal capacitor to allow formation of circuitry that functions as an LC filter and a bypass capacitor. It is therefore no longer necessary to dispose a chip capacitor or filter element at the surface of the wiring board. A wiring board further reduced in size than conventional wiring board 101 can be obtained. Accordingly, application to electronic components in a cellular phone, a digital camera, and the like is facilitated.

It is appreciated from the above description that the wiring board of the present invention includes a first conductor formation substrate having a first substrate, and a plurality of first conductors formed on the plane of the first substrate spaced apart; a second conductor formation substrate having a second substrate and a plurality of second conductors formed at the second substrate, the second conductor being arranged facing the first conductor; and a dielectric interposed between the first and second conductor formation substrates. The wiring board has at least the dielectric formed by thermo-compression bonding. The dielectric includes an adherent insulator having a melting point lower than the temperature reached during thermo-compression bonding, and rendered molten during the thermo-compression bonding, and a dielectric film interposed between the first and second conductors, having its surface subjected to a treatment to improve wettability with the molten adherent insulator, and having a melting point higher than the temperature reached during thermo-compression bonding. Therefore, the difference in the distance between the first and second conductors depending upon the site becomes smaller. Also, adherence between the dielectric film and adherent insulator is increased. Therefore, delamination between the dielectric film and adherent insulator will not easily occur.

The adherent insulator is located only between the dielectric film and the first conductor formation substrate. The dielectric film has its face of the first conductor formation substrate side subjected to a treatment to improve wettability and its face of the second conductor formation substrate side subjected to a process to improve adherence with the second conductor. Therefore, delamination between the dielectric film and the second conductor will not easily occur, as between the dielectric film and the adherent insulator.

The first and second conductors correspond to plate-like electrodes. The first conductor, the second conductor, and the dielectric between the first and second conductors constitute an internal capacitor. Therefore, the space to arrange a capacitor on the wiring board is no longer necessary, leading to a smaller wiring board.

The first and second conductors correspond to conductor lines formed in an eddy manner. The first conductor, the second conductor, and the electrical connection located in the through hole formed in the dielectric, electrically connecting the first and second conductors so that the winding direction is identical, constitute an internal inductor. Therefore, the space to dispose an inductor on the wiring board is no longer necessary, leading to a smaller wiring board.

The through hole is formed by laser, and the first conductor has its face of the dielectric side subjected to a treatment to reduce the reflectance of the laser. Therefore, the laser energy can be readily absorbed at the first conductor during the formation step of a through hole using laser. By the temperature increase caused by absorption, formation of a through hole is facilitated.

The dielectric film is formed of at least a dielectric parent material, and powder of a dielectric constant, higher than that of the parent material, mixed into the parent material. Therefore, the capacitive density of an internal capacitor can be increased.

The dielectric film is formed of at least a dielectric parent material, and powder of high magnetic permeability, higher than that of the parent material, mixed into the parent material. Therefore, the inductance can be increased when an internal inductor is formed.

The fabrication method of a wiring board according to the present invention includes a first conductor formation substrate step of forming a first conductor formation substrate with a first conductor provided on the first substrate; a first insulation film stacking step of stacking an adherent insulation film having a melting point lower than the temperature reached during thermo-compression bonding on the first conductor side of the first conductor formation substrate; a dielectric film processing step subjecting the dielectric film to a treatment to improve wettability; a dielectric film stacking step of stacking the dielectric film on the adherent insulation film; a second insulation film stacking step of stacking an adherent insulation film having a melting point lower than the temperature during the thermo-compression bonding on the dielectric film after the dielectric film stacking process; a conductor film stacking step of providing a plate-like conductor film at the adherent insulation film stacked in the second insulation film stacking step; a thermo-compression bonding step of rendering the adherent insulation film molten by thermo-compression bonding and pressing the first conductor and the conductor film in a direction approaching each other; a second conductor formation step of forming a conductor film as a plurality of second conductors on the dielectric film; and a second conductor formation substrate step of covering the second conductor with the second substrate to form the second conductor formation substrate. During the thermo-compression bonding step, the adherent insulation film is extruded respectively, with the dielectric film sagging, from the region between the first conductor and the dielectric film and between the conductor film facing the first conductor and the dielectric film to be formed as the adherent insulator. The dielectric is formed by the dielectric film and the adherent insulator. Therefore, the wiring board can be fabricated in a short period of time easily.

The total thickness of the adherent insulation film stacked in the first insulation film step and the adherent insulation film stacked in the second insulation film step is set smaller than the thickness of the first conductor. Therefore, the molten insulation film between the first conductor and the second conductor is easily extruded therefrom in the thermo-compression bonding step.

The fabrication method of a wiring board according to the present invention includes: a first conductor formation substrate step of forming a first conductor formation substrate with a first conductor provided on a first substrate; a first insulation film stacking step of stacking an adherent insulation film having a melting point lower than the temperature reached during the thermo-compression bonding step at the first conductor side of the first conductor formation substrate; a dielectric film processing step of applying a treatment on a plane of the dielectric film to improve wettability and a treatment on the other plane of the dielectric film to improve adherence; a dielectric film stacking step of stacking the dielectric film on the adherent insulation film with the plane of the dielectric film facing the adherent insulation film; a conductor film stacking process of providing a conductor film at the other plane of the dielectric film; a thermo-compression bonding step of rendering the adherent insulation film molten by thermo-compression bonding and pressing the first conductor and the conductor film in a direction approaching each other; a second conductor formation step of forming the conductor film as the second conductor on the dielectric film; and a second conductor formation substrate step of forming a second conductor formation substrate by covering the second conductor with the second substrate. In the thermo-compression bonding step, the adherent insulation film is extruded from the region between the first electrode and the dielectric film to be formed as the adherent insulator. The dielectric is formed by the dielectric film and adherent insulator. Therefore, a wiring board can be fabricated easily in a short period of time.

Since the thickness of the adherent insulation film is set smaller than the thickness of the first conductor, the molten adherent insulation film molten between the first conductor and the dielectric film in the thermo-compression bonding step is easily extruded therefrom.

The fabrication method of a wiring substrate according to the present invention further includes a first conductor processing step of subjecting the surface of the first conductor to a treatment reducing the reflectance of laser; a through hole formation step of directing laser towards the surface of the first conductor to form a through hole, prior to a second conductor formation substrate step; and an electrical connecting step of forming an electrical connection between the first conductor and the second conductor through the through hole to establish electrical connection between the first and second conductors. Therefore, formation of a through hole using laser can be carried out easily in a shorter period of time. Therefore, the fabrication period of time of a wiring board is reduced.

Fourth Embodiment

Figure 11:
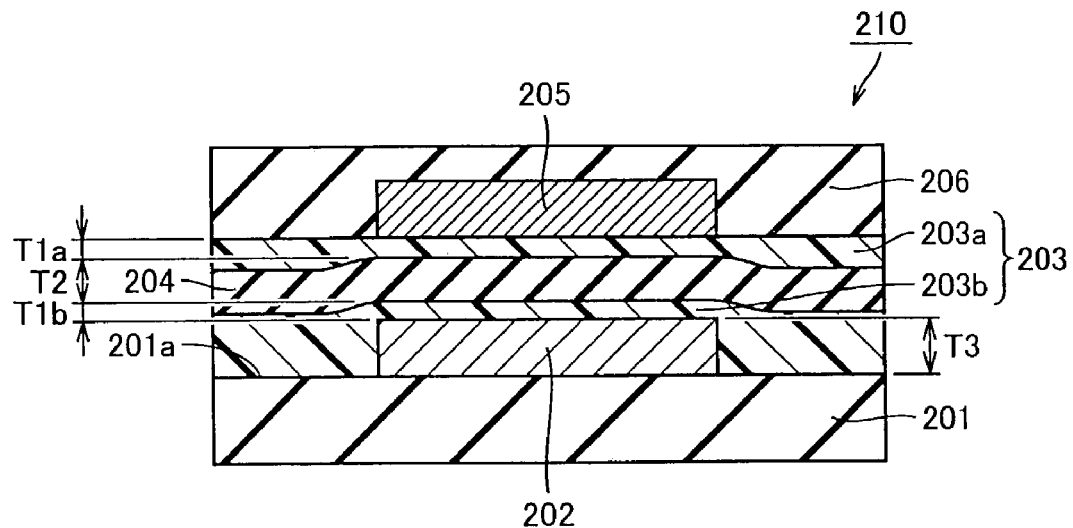
FIG. 11 is a sectional view of a printed wiring board according to a fourth embodiment of the present invention.

Referring to FIG. 11, a printed wiring board 210 according to a fourth embodiment of the present invention includes a substrate 201 with a main surface 201a, a conductor film 202 provided on main surface 201a of substrate 201, a substrate 206 and a conductor film 205 facing substrate 201 and conductor film 202, respectively, an adhesive agent 203a between conductor films 202 and 205, a film-like dielectric film 204, and an adhesive agent 203b. In printed wiring board 210 is formed a capacitor including conductor films 202 and 205 facing each other as electrodes, and adhesive agent 203a, dielectric film 204 in film form, and adhesive agent 203b provided between the electrodes as a dielectric.

Conductor film 202 is provided on main surface 201a of substrate 201 so as to protrude from main surface 201a. Substrate 201 is formed of epoxy glass. Conductor film 202 is formed of copper, having a thickness T3. Although substrate 201 is formed of epoxy glass in the present embodiment, glass bis maleimide triazine, glass polyphenylene oxide, polyimide, paper based phenolic resin, alumina, or the like may be used instead of epoxy glass.

Adhesive agent 203b is provided so as to cover conductor film 202 and main surface 201a of substrate 201 exposed at conductor film 202. Dielectric film 204 and adhesive agent 203a are sequentially stacked on adhesive agent 203b. The top face of adhesive agent 203s is formed flat.

Adhesive agents 203a and 203b are formed of thermosetting epoxy resin cured at the temperature of 180° C. having the viscosity of $1 \times 10^5$ (P) at the temperature of 150° C. Dielectric film 204 is formed of polyphenylene sulfide having a relative permittivity of 3. In the fabrication step of printed wiring board 210 having adhesive agents 203a and 203b stacked at predetermined positions, adhesive agents 203a and 203b have flowability. Dielectric film 204 in film form attains a solid state in a condition under which adhesive agents 203a and 203b have flowability.

It is to be noted that adhesive agents 203a and 203b can be formed of another material exhibiting flowability under the conditions of the stacking step, and superior adherence with conductor film 202, substrate 201 and dielectric film 204 in film form. Such materials include a bis maleimide triazine resin, urethane resin, melamine resin, silicon resin, the polyacrylic resin, urea resin, or phenol resin.

Dielectric film 204 in film form may be formed of another material that does not melt or decompose in a condition under which adhesive agents 203a and 203b exhibit flowability. Such materials include polyphenyl sulfone, polyimide, polyether imide, polyphenyl oxide, polyamide, polycarbonate, liquid crystal polyester, polyester, polyvinyl chloride, poly silane, poly ethyl ether ketone, acetate, or polypropylene On the top face of adhesive agent 203a is provided conductor film 205 at a site corresponding to conductor film 202. Conductor film 205 is formed of copper. Substrate 206 is provided so as to cover conductor film 205 and the top face of adhesive agent 203a exposed at conductor film 205. Substrate 206 is formed of a material such as epoxy glass, likewise substrate 201. Although conductor films 202 and 205 are formed of copper in the present embodiment, other materials having sufficient conductivity to function as the electrode of a capacitor may be employed. Such a material includes other metals or a conductive polymer such as polythiophene.

Adhesive agent 203b, dielectric film 204 in film form and adhesive agent 203a provided at the region where conductor films 202 and 205 face each other have the thickness of T1b, T2 and T1a, respectively. Adhesive agents 203a and 203b constitute adhesive agent 203. Adhesive agent 203 has the thickness of T1=T1a+T1b. Specifically, a dielectric film having the thickness of T=T1+T2 is provided between dielectric films 202 and 205. The thickness ratio T1/T of adhesive agent 203 to this dielectric film satisfies the relationship of 0<T1/T≦0.4.

The capacitive density of a capacitor formed of conductor films 202 and 205 facing each other, adhesive agents 203a and 203b provided between conductor films 202 and 205, and dielectric film 204 in film form is obtained by the following Equation (1). The capacitive density of a capacitor is the electrostatic capacity per unit area of the capacitor. Since the additive rule of the dielectric constant is established between adhesive agents 203a and 203b and dielectric film 204 in film form, the dielectric constant ∈ of the dielectric film can be obtained from Equation (1).

Capacitive density of capacitor=dielectric constant ∈ of dielectric film/thickness T of dielectric film. (1)

Therefore, the desired capacitive density of a capacitor can be obtained by setting the thickness of adhesive agents 203a and 203b and dielectric film 204 forming the dielectric film at a predetermined thickness under the condition that the ratio of the thickness of adhesive agent 203 to the thickness of the dielectric film satisfies the relationship of 0<T1/T≦0.4. In the present invention, dielectric film 204 is formed of polyphenylene sulfide, and adhesive agent 203 is formed of epoxy glass. The capacitive density of the capacitor can be set to the desired level by forming dielectric film 204 and adhesive agent 203 from materials having the appropriate dielectric constant.

Printed wiring board 210 identified as the wiring board of the fourth embodiment includes conductor films 202 and 205 identified as first and second conductor film facing each other; adhesive agents 203a and 203b provided between conductor films 202 and 205, identified as a first dielectric film brought into contact with at least one of conductor films 202 and 205; and a dielectric film 204 in film form between conductor films 202 and 205, identified as a second dielectric film attaining a solid state in a condition under which adhesive agents 203a and 203b have flowability. The relationship of 0<T1/(T1+T2)≦0.4 is satisfied, where T1 is the thickness of adhesive agents 203a and 203b and T2 is the thickness of dielectric film 204 in film form.

Printed wiring board 210 further includes a substrate 201 having a main surface 201a from which conductor film 202 is provided in a protruding manner. Adhesive agent 203b is provided so as to cover conductor film 202 and main surface 201a.

By alternately stacking an insulation layer and a conductor layer on conductor film 205 and establish electrical connection between respective layers, printed wiring board 210 may be adapted as a multilayer printed wiring board.

A method of fabricating printed wiring board 210 of FIG. 11 will be described with reference to FIGS. 11–17.

Figure 12:
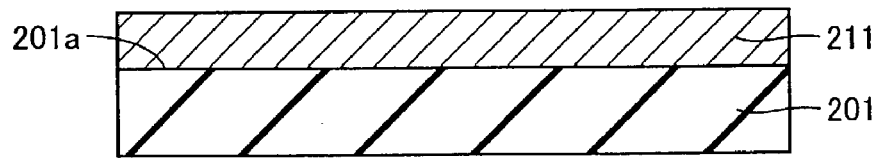
FIGS. 12–17 are sectional views of the printed wiring board of FIG. 11 corresponding to steps of a fabrication method thereof.

Referring to FIG. 12, main surface 201a of substrate 201 is plated with copper, whereby a copper foil 211 having a thickness T3 is formed. Alternatively, a double-sided coppered plate may be used instead of applying copper-plating on substrate 201.

Figure 13:
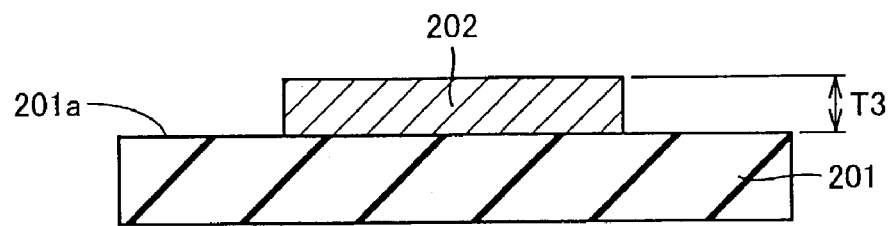

Referring to FIG. 13, a resist film (not shown) having a predetermined pattern configuration is formed on copper foil 211. Using this resist film as a mask, copper foil 211 is etched to remove a portion of copper foil 211. Then, the resist film (not shown) is removed. Accordingly, a conductor film 202 of T3 in thickness is formed on main surface 201a of substrate 201.

Figure 14:
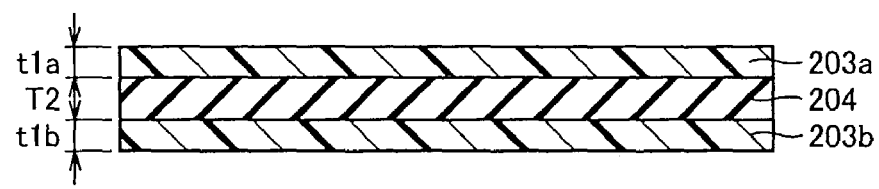

Referring to FIG. 14, adhesive agents 203a and 203b having the thickness of t1a and t1b, respectively, are provided on both sides of dielectric film 204 having a thickness T2, in addition to the steps carried out on substrate 201 shown in FIGS. 12 and 13. At this stage, adhesive 203 formed of adhesive agents 203a and 203b have the thickness of t1=t1a+t1b. Therefore, a layered body of a dielectric film formed of adhesive agent 203a, dielectric film 204, and adhesive agent 203b is deposited.

The wettability and adherence of dielectric film 204 in film form to adhesive agents 203a and 203b can be improved by subjecting the surface of dielectric film 204 to a corona discharge treatment, ozone treatment, or oxygen plasma treatment. For the purpose of protecting the laminate of the dielectric film, a cover film (not shown) is laminated on the surface of adhesive agents 203a and 203b until the next subsequent step.

Figure 15:
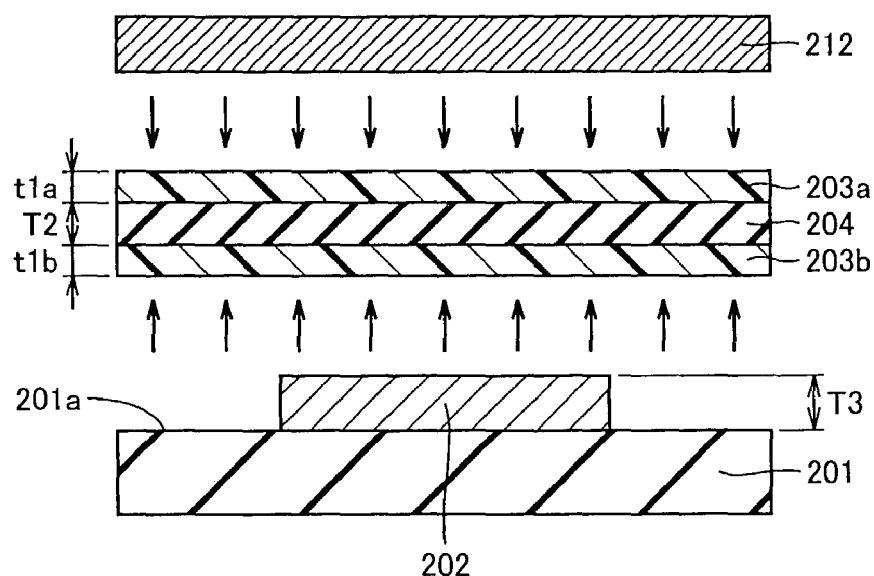

Referring to FIG. 15, a copper foil 212 is prepared. Respective members are positioned so as to sandwich the stacked dielectric film of adhesive agent 203a, dielectric film 204 and adhesive agent 203b between substrate 201 on which conductor film 202 is formed and copper foil 212.

Substrate 201 and copper foil 212 are sandwiched from opposite sides with pressure plates in the positioned state. Compression is applied by vacuum heating pressing. At this stage, compression is applied until the thickness t1a and t1b of adhesive agents 203a and 203b is reduced to thickness T1a and T1b, respectively, at the region between conductive film 202 and copper foil 212.

As a pressure plate employed in the vacuum heat press, a stainless steel (SUS) plate having a thickness of 2 mm is used. The rate of increase in temperature is 3 (° C./min), and the highest temperature is 180° C. Although a vacuum heat press is employed in the present embodiment, heat press, laminator, or a combination thereof may be appropriately used.

Figure 16:
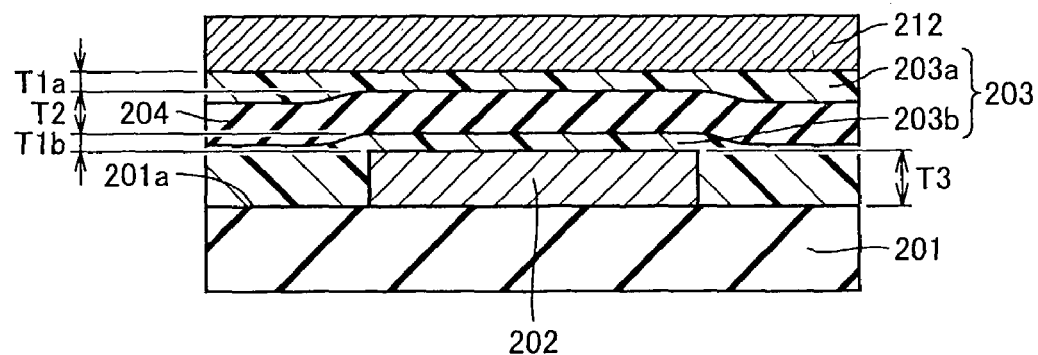

Referring to FIG. 16, copper foil 212, the laminate of the dielectric film, and substrate 201 with conductor film 202 are formed as an integral part by the solidification of adhesive agents 203a and 203b through the step of FIG. 15.

Figure 17:
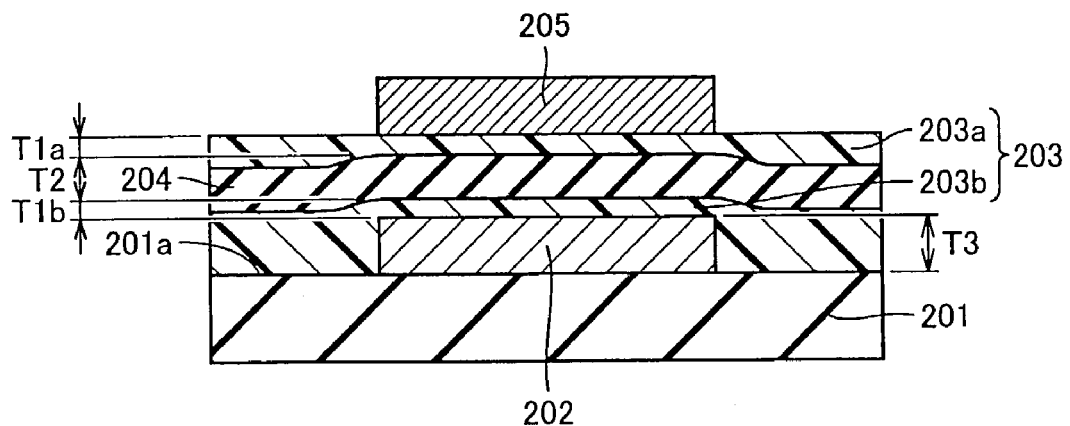

Referring to FIG. 17, a resist pattern (not shown) having a predetermined pattern is formed on copper foil 212. Using this resist film as a mask, copper foil 212 is etched, whereby copper foil 212 is partially removed. Then, the resist film (not shown) is removed. Thus, conductor film 205 is formed on adhesive agent 203a.

Referring to FIG. 11, substrate 206 formed of epoxy glass is provided so as to cover conductor film 205 and the top face of adhesive agent 203a exposed at conductor film 205. By the above-described step, printed wiring board 210 of FIG. 11 is completed.

The method of fabricating printed wiring board 210 as the wiring board according to the fourth embodiment of the present invention includes the steps of positioning adhesive agent 203 having flowability and a thickness t1, and dielectric film 204 attaining a solid state and having a thickness T2, between conductor films 202 and 205, applying compression on conductor films 202 and 205 until thickness t1 of adhesive agent 203 becomes thickness T1 satisfying the relationship of $0<T1/(T1+T2) \leq 0.4$, and hardening the adhesive agent after the compression step.

According to printed wiring board 210 and the fabrication method of printed wiring board 210, the dielectric of a capacitor incorporated in printed wiring board 210 is formed of adhesive agents 203a and 203b having flowability during the stacking step in the fabrication process, and dielectric film 204 in film form attaining a solid state. Therefore, dielectric film 204 functions as a spacer during the pressing step shown in FIG. 5 to prevent short-circuiting between electrodes caused by contact between conductor films 202 and 205. Particularly in the case where the distance between conductor films 202 and 205 must be reduced for the purpose of achieving a higher capacitive density for the capacitor, the occurrence of shorting between electrodes can be reliably suppressed.

In the step shown in FIG. 15, adhesive agents 203a and 203b exhibit flowability on main surface 201a of substrate 201 until the thickness of t1a and t1b of adhesive agents 203a and 203b becomes T1a and T1b, respectively. Asperity at main surface 201a of substrate 201 will lead to variation in the pressure applied in the pressing step. Accordingly, there will be difference in the amount of flow of adhesive agents 203a and 203b depending upon site. This will cause uneven thickness of the dielectric film after the press step to account for variation in the capacitive density of a capacitor. The influence caused by difference in the flowing amount of adhesive agents 203a and 203b is relatively increased when the thickness of the dielectric film is to be reduced, leading to great variation in the capacitive density of a capacitor.

However, by virtue of dielectric film 204 in film form, adhesive agents 203a and 203b can be set thin with the capacitive density of the capacitor at the same level. By eliminating the variation, a printed wiring board 210 incorporating a capacitor with the desired capacitive level can be realized.

The ratio T1/T of the thickness of adhesive agent 203 to the thickness of the entire dielectric film meets the relationship of $0<T1/T \leq 0.4$. If T1/T is larger than 0.4, adhesive agent 203 having flowability is too thick with respect to the entire dielectric film, so that the advantage of employing the above-described dielectric film 204 in film form cannot be yielded. By setting T1/T within the range of $0<T1/T \leq 0.4$, variation in the capacitive density of capacitor can be sufficiently suppressed.

Adhesive agent 203b is provided in contact with conductor film 202 protruding from main surface 201a of substrate 201. When adhesive agent 203b is stacked so as to cover conductor film 202 and substrate 201, adhesive agent 203b attains flowability. Therefore, adherence of adhesive agent 203b to conductor film 202 and substrate 201 can be ensured. Also, generation of defects such as a pin hole, crack or void in the dielectric film can be suppressed. Thus, the capacitor provided in printed wiring board 210 can be operated at the desired state.

Fifth Embodiment

A printed wiring board according to a fifth embodiment of the present invention has a structure identical to the structure of printed wiring board 210 of the fourth embodiment. The printed wiring board of the fifth embodiment differs from printed wiring board 210 of the fourth embodiment in the fabrication method.

Figure 18:
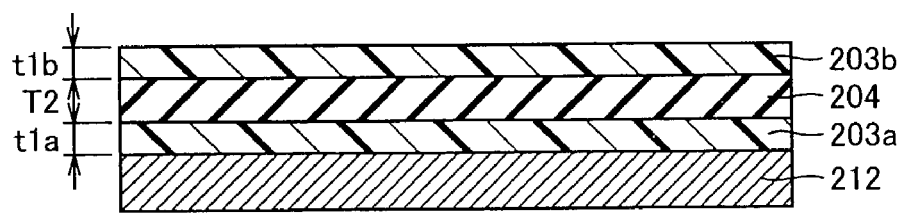
FIGS. 18–19 are sectional views of a printed wiring board according to a fifth embodiment of the present invention corresponding to steps of a fabrication method thereof.
Figure 19:
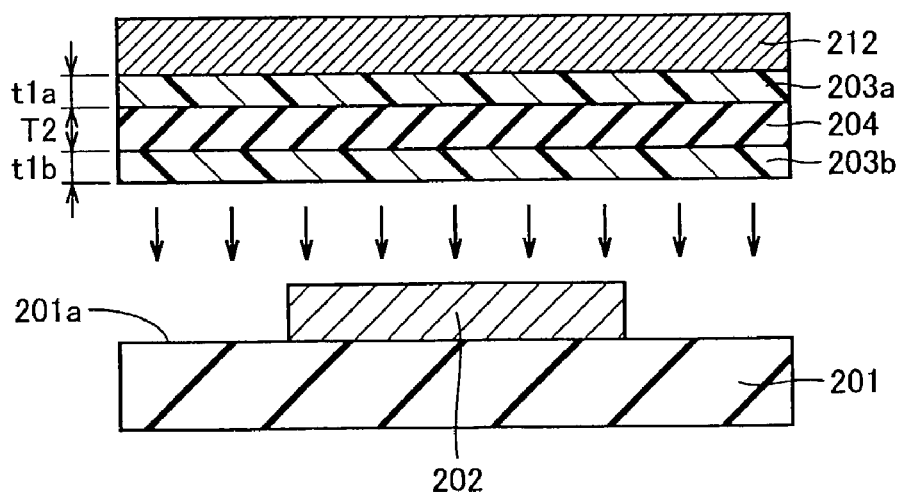

Following the steps shown in FIGS. 12 and 13 of the fabrication method of printed wiring board 210 of the fourth embodiment, the process proceeds to the steps shown in FIGS. 18 and 19. Then, the steps shown in FIGS. 16, 17 and 11 according to the fabrication method of printed wiring board 210 of the fourth embodiment are conducted. In the following, description of similar fabrication steps will not be repeated.

Referring to FIG. 18, on the surface of copper foil 212 are sequentially stacked adhesive agent 203a having a thickness t1a, a dielectric film 204 in film form having a thickness T2, and adhesive agent 203b having a thickness t1b.

Referring to FIG. 19, the layered body of adhesive agent 203b, dielectric film 204, adhesive agent 203a and copper foil 212 is positioned so that conductor film 202 formed on substrate 201 faces adhesive agent 203b. Then, substrate 201 and copper foil 212 are sandwiched between pressure plates from both sides in the positioned state. Pressing is conducted by a vacuum heat press. This pressing step is continued until adhesive agents 203a and 203b become thinner from thickness t1a and t1b to thickness T1a and T1b, respectively, at the region between conductor film 202 and copper foil 212.

In the fabrication method of a printed wiring board according to the fifth embodiment of the present invention, the step of positioning adhesive agents 203a and 203b and dielectric film 204 includes the steps of forming on conductor film 205 a laminate of the layers of adhesive agents 203a and 203b and dielectric film 204, and stacking the laminate on conductor film 202.

According to the above fabrication method of a printed wiring board, adhesive agent 203a, dielectric film 204 and adhesive agent 203b are sequentially layered on the base of copper foil 212 that is highly rigid. Therefore, handling of these stack layers is facilitated during the press step shown in FIG. 9 despite the low rigidity of adhesive agent 203a, dielectric film 204 and adhesive agent 203b. Furthermore, it is not necessary to provide a cover film on the surface of adhesive agent 203a located at the copper foil 212 side for protecting adhesive agent 203a. Thus, the printed wiring board fabrication can be conducted more readily and in a simplified manner.

Sixth Embodiment

Figure 20:
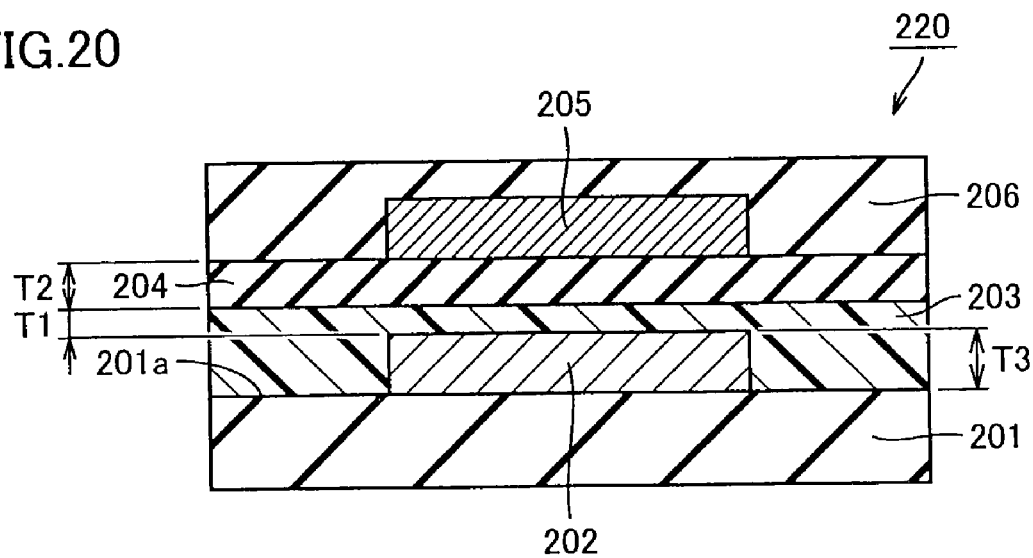
FIG. 20 is a sectional view of a printed wiring board according to a sixth embodiment of the present invention.

Referring to FIG. 20, a printed wiring board 220 according to a sixth embodiment of the present invention has a structure basically similar to that of printed wiring board 210 of the fourth embodiment. In the following, description of similar elements in the structure will not be repeated.

Adhesive agent 203 is provided so as to cover conductor film 202 and main surface 201a of substrate 201 exposed at conductor film 202. Dielectric film 204 in film form is provided on adhesive agent 203. The top face of dielectric film 204 is set flat. On the top face of dielectric film 204 is provided dielectric film 205 formed of copper, facing conductor film 202. Substrate 206 formed of epoxy glass is provided so as to cover conductor film 205 and the top face of dielectric film 204 exposed at conductor film 205.

Adhesive agent 203 is formed of epoxy resin or the like, whereas dielectric film 204 is formed of polyphenylene sulfide or the like. In the fabrication step of applying adhesive agent 203 at a predetermined position of printed wiring board 220, adhesive agent 203 exhibits flowability. Dielectric film 204 in film form attains a solid state in the condition under which adhesive agent 203 has flowability.

Adhesive agent 203 and dielectric film 204 provided at the region where conductive films 202 and 205 face each other have the thickness of T1 and T2, respectively. A dielectric film having the thickness of $T=T1+T2$ is provided between conductor films 202 and 205. The ratio $T1/T$ of the thickness of adhesive agent 203 to the thickness of this dielectric film meets the relationship of $0 < T1/T \leq 0.4$.

In printed wiring board 220 according to the sixth embodiment of the present invention, adhesive agent 203 is provided so as to form contact with only conductor film 202 among conductor films 202 and 205.

Following the steps shown in FIGS. 12 and 13 according to the fabrication method of printed wiring board 210 of the fourth embodiment, the process proceeds to the steps shown in FIGS. 21–25 and FIG. 20. In the following, description of similar fabrication steps will not be repeated.

Figure 21:
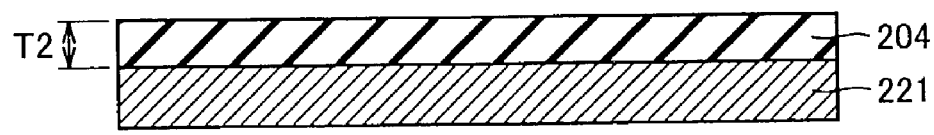
FIGS. 21–25 are sectional views of the printed wiring board of FIG. 20 corresponding to steps of a fabrication method thereof.

Referring to FIG. 21, a dielectric film 204 in film form having a thickness T2 is thermo-compression bonded at the surface of copper foil 221. When dielectric film 204 identified as a dielectric is to be provided at the surface of copper foil 221, a dielectric dissolved in a solvent may be applied on the surface of copper foil 221. Also, a ceramic dielectric may be deposited on the surface of copper foil 221 by a wet way such as the sol-gel process. Furthermore, a dielectric may be attached to the surface of copper foil 221 by vapor deposition such as chemical vapor deposition. Also, copper foil 221 may be an anodic-oxidized to form a dielectric at the surface of copper foil 221.

Figure 22:
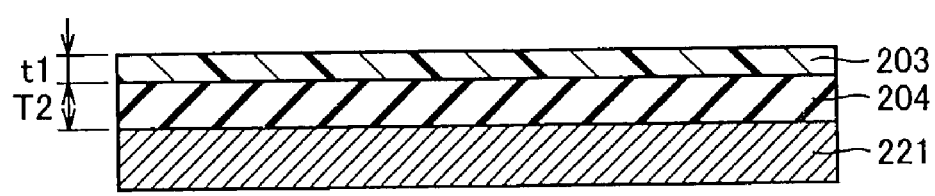

Referring to FIG. 22, adhesive agent 203 having a thickness t1 is provided on dielectric film 204. At this stage, adhesive agent 203 is selected so that the thickness t1 of adhesive agent 203 covering conductor film 202 becomes smaller than the thickness T3 of conductor film 202 at a subsequent step.

Figure 23:
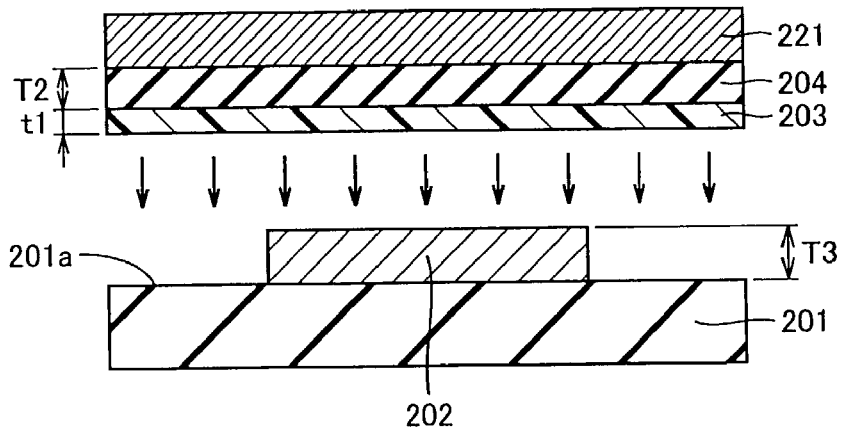

Referring to FIG. 23, the laminate body including adhesive agent 203, dielectric film 204 and copper foil 221 is positioned with respect to substrate 201 so that conductor film 203 on substrate 201 faces adhesive agent 203. Substrate 201 and copper foil 221 are sandwiched between pressure plates in the positioned state. Pressing is applied on both sides by a vacuum heat press. At this stage, pressing is conducted until adhesive agent 203 becomes thinner from thickness t1 to thickness T1 at the region between conductor film 202 and copper foil 221.

Figure 24:
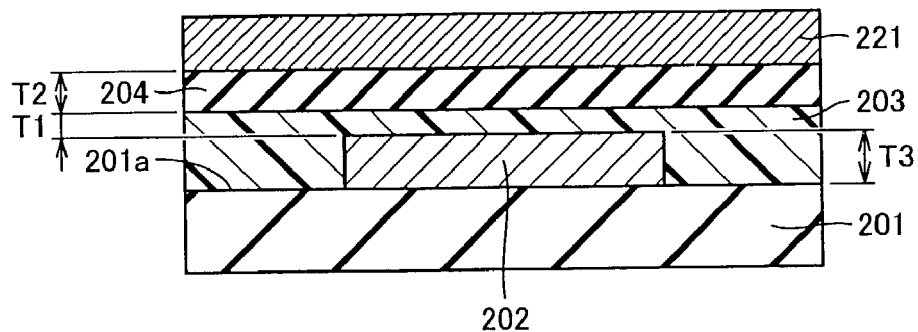

Referring to FIG. 24, the laminate of adhesive agent 203, dielectric film 204 and copper foil 221 forms an integral part with substrate 201 having conductor film 202 formed by the hardening of adhesive agent 203 in the step shown in FIG. 23.

Figure 25:
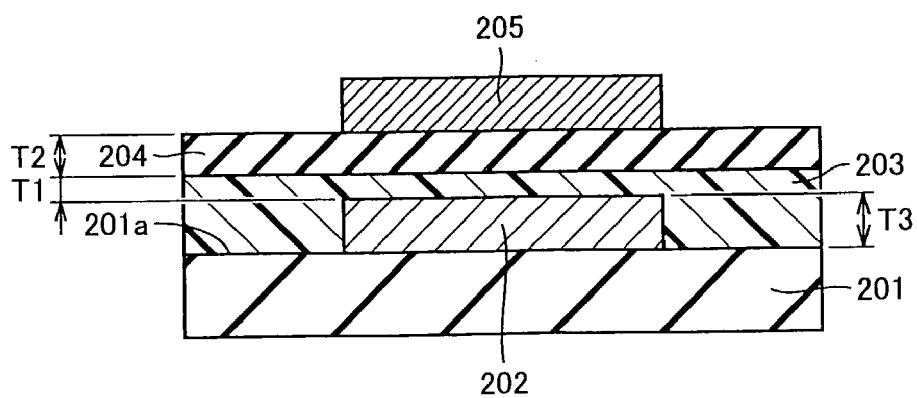

Referring to FIG. 25, a resist pattern (not shown) having a predetermined pattern is formed on copper foil 221. Using this resist film as a mask, copper foil 221 is etched to remove a portion thereof. Then, the resist film (not shown) is removed. Thus, conductor film 205 is formed on dielectric film 204.

Referring to FIG. 20, substrate 206 formed of epoxy glass is provided so as to cover conductor film 205 and the top face of adhesive agent 203a exposed at conductor film 205. By the above-described steps, printed wiring board 220 of FIG. 20 is completed.

According to printed wiring board 220 and the fabrication method of printed wiring board 220 according to the sixth embodiment of the present invention, conductor film 202 has a thickness T3 at the region on main surface 201a of substrate 201. Adhesive agent 203 identified as the first dielectric film is provided so as to cover conductor film 202 and main surface 201a. Thickness t1 of adhesive agent 203 prior to the pressing step meets the relationship of $t1 < T3$.

According to printed wiring board 220 and the fabrication method thereof, conductor film 205 is provided in direct contact with dielectric film 204, absent of an adhesive agent. Conductor film 205 does not protrude from substrate 206. Relatively favorable adherence between conductor film 205 and the dielectric film can be obtained despite the absence of an adhesive agent. Thus, the capacitor incorporated in printed wiring board 220 can be formed of the four layers of conductor film 205, dielectric film 204, adhesive agent 203 and conductor film 202. The yield in the fabrication of printed wiring board 220 can be improved. Also, material control can be simplified. Therefore, a printed wiring board 220 can be fabricated in an economic manner.

If the thickness of the dielectric film is reduced, the tensile strength of the dielectric film will be degraded. Tension exceeding a predetermined level may be applied during the fabrication step, leading to fracture of the dielectric film. However, no tension is imposed on the dielectric film when dielectric film 204 is thermo-compression bonded to the surface of metal foil 221, or when a dielectric dissolved in a solvent is applied on the surface of copper foil 221. Therefore, a thin dielectric film can be provided to increase the capacitive density of the capacitor.

Adhesive agent 203 is provided so that thickness t1 thereof becomes smaller than thickness T3 of conductor film 202 at the step shown in FIG. 23. Accordingly, the press step can be carried out rapidly and readily.

Adhesive agent 203 provided at one side face of dielectric film 204 partially extrudes outwards from main surface 201a of substrate 201 until thickness t1 of adhesive agent 203 t1 is reduced to thickness T1. However, some time is required for adhesive agent 203 to move along on main surface 201a of substrate 201. Since adhesive agent 203 includes thermosetting epoxy resin, adhesive agent 203 may begin to harden when the portion of adhesive agent 203 to be extruded outwards is still present on main surface 201a of substrate 201.

This problem can be overcome to allow the press step to be carried out rapidly and readily by setting thickness t1 of adhesive agent 203 prior to the pressing step smaller than thickness T3 of conductor film 202. The portion of adhesive agent 203 located on conductor film 202 moves towards main surface 201a of substrate 201 by the pressing step. Therefore, the above advantage can be provided by setting the top face of adhesive agent 203 higher than the top face of conductor film 202 to ensure complete coverage of adhesive agent 203 on conductor film 202.

It is preferable to adjust thickness ti of adhesive agent 203 prior to the pressing step depending upon the ratio of conductor film 202 on main surface 201a to the area of main surface 201a of substrate 201 (referred to as area occupying ratio of conductor film 202, hereinafter).

When the area occupying ratio of conductor film 202 is relatively small, adhesive agent 203 on conductor film 202 readily flows on main surface 201a of substrate 201. Therefore, a larger amount of adhesive agent moving on main surface 201a is required. Thickness t1 of adhesive agent 203 prior to the press step takes a value approximating thickness T3 of conductor film 202. In the case where the area occupying ratio of conductor film 202 is relatively large, adhesive agent 203 on conductor film 202 is less flowable on main surface 201a of substrate 201. Therefore, less adhesive agent moving on main surface 201a is required. Thickness t1 of adhesive agent 203 prior to a pressing step takes a smaller value.

When the area occupying ratio of conductor film 202 is set to 15%, thickness t1 of adhesive agent 203 prior to the pressing step is set to 10 µm with respect to conductor film 202 having a thickness T3 of 18 µm. However, if the area occupying ratio of conductor film 202 is 10%, thickness t1 of adhesive agent 203 prior to the pressing step is set to a larger value. If the area occupying ratio of conductor film 202 is 50%, thickness t1 of adhesive agent 203 prior to the pressing step is set to a smaller value.

Seventh Embodiment

Figure 26:
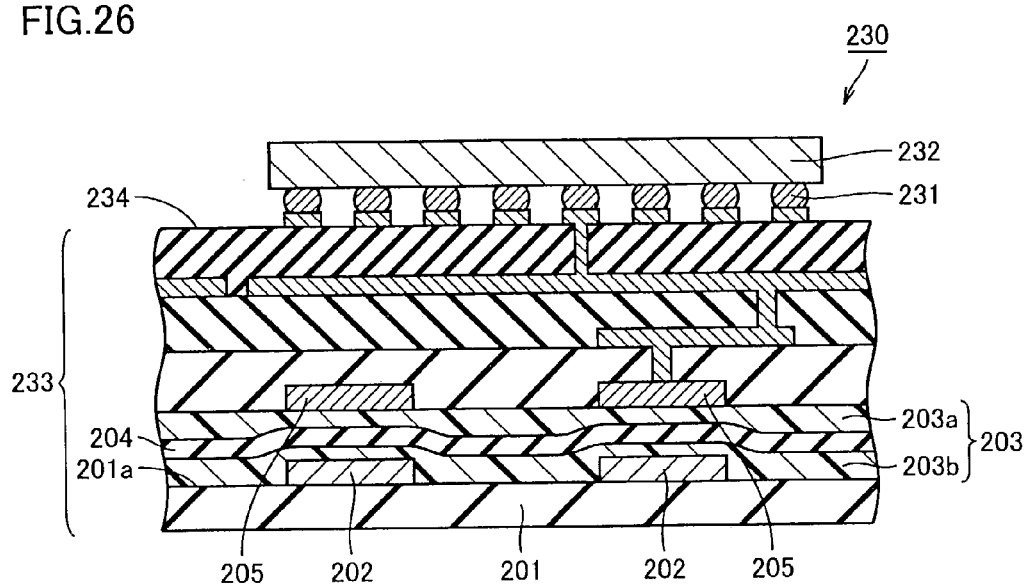
FIG. 26 is a sectional view of a semiconductor device according to a seventh embodiment of the present invention.
Figure 27:
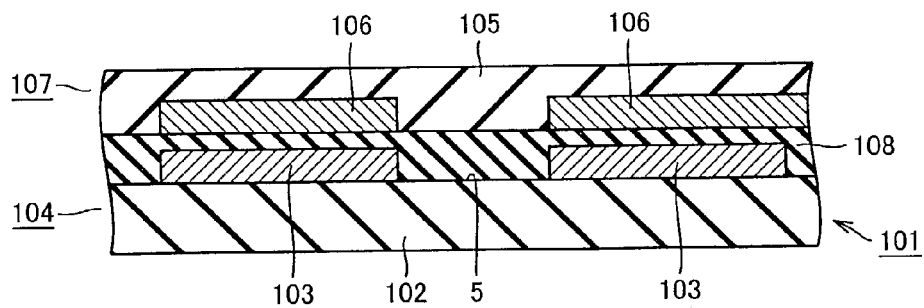
FIG. 27 is a sectional view of a conventional wiring board.
Figure 28:
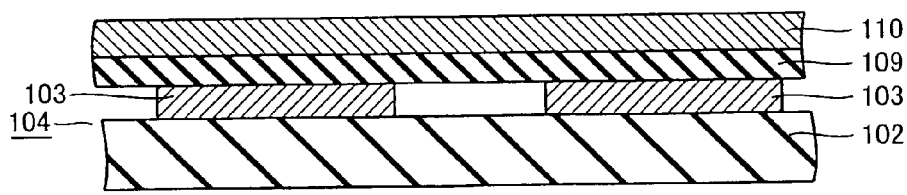
FIG. 28 is a schematic diagram of a wiring board having a dielectric sheet and metal foil stacked at a first conductor formation substrate.
Figure 29:
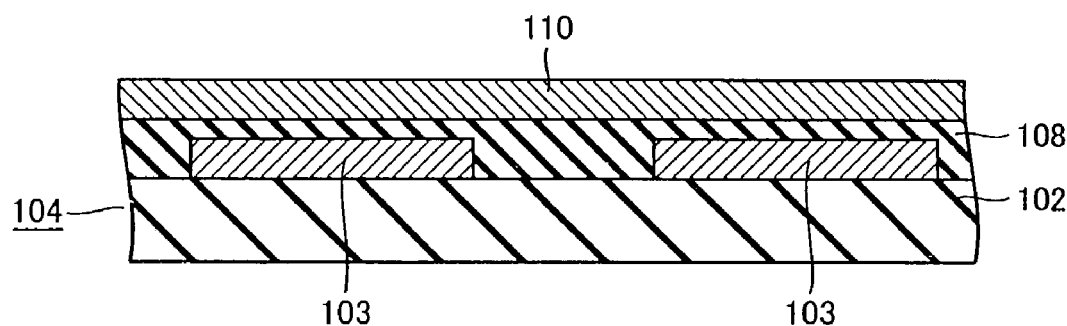
FIG. 29 is a schematic diagram of the wiring board of FIG. 28 after a thermo-compression bonding step.
Figure 30:
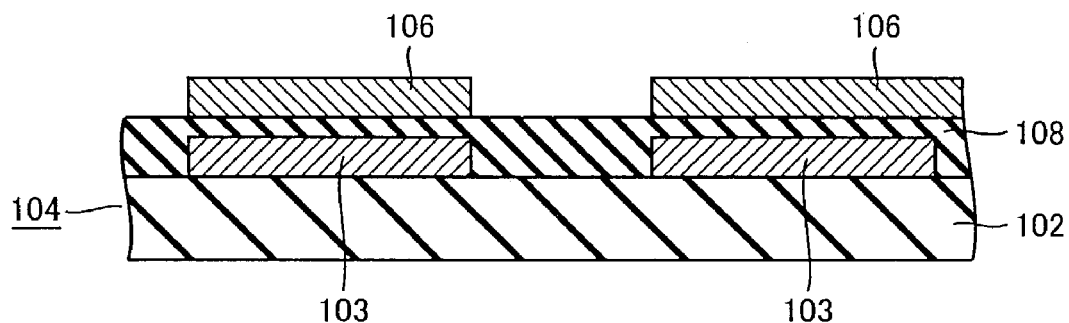
FIG. 30 is a schematic diagram of the wiring board of FIG. 29 after the metal foil of FIG. 29 has been formed as a second electrode.

Referring to FIG. 26, a semiconductor device 230 according to a seventh embodiment of the present invention includes a multilayer printed wiring board 233, and a semiconductor chip 232 on multilayer printed wiring board 233. Similar to printed wiring board 210 of the fourth embodiment, substrate 201 has conductor film 202, adhesive agent 203b, dielectric film 204 in film form, adhesive agent 203a and conductor film 205 sequentially stacked thereon. An insulator layer and conductor layer are alternately stacked on conductor film 205. Multilayer printed wiring board 233 with a top face 234 is formed.

A plurality of bumps 231 are provided on top face 234 of multilayer printed wiring board 233. Semiconductor chip 232 electrically connected to bumps 231 is provided. Electrical connection is established between bumps 231 and conductor film 205 through the wiring extending between the layers of multilayer printed wiring board 233.

Semiconductor device 230 according to the seventh embodiment includes multilayer printed wiring board 233, and semiconductor chip 232 identified as a semiconductor element connected to conductor film 205 identified as at least one of conductor films 202 and 205.

According to semiconductor device 230 of the above-described structure, advantages described with reference to the fourth embodiment can be offered at multilayer printed wiring board 233 electrically connected to semiconductor chip 232.

Referring to FIG. 11, substrates 201 and 206 are formed of epoxy glass base material having a square configuration of 340 mm×340 mm. A capacitor includes dielectric film 202 having a thickness T3 of 18 µm and conductor film 205 facing conductor film 202 as electrodes, and adhesive agent 203 having a thickness T1 of T1a (adhesive agent 203a)+T1b (adhesive agent 203b), and dielectric film 204 in film form having a thickness T2 as a dielectric film. 784 of such capacitors are formed in matrix for every 10 mm in an area excluding the perimeter region of 30 mm from the edge of substrates 201 and 206. To establish electrical connection between conductor films 202 and 205, holes are formed extending to conductor films 202 and 205 using a carbon dioxide gas laser apparatus. The hole is subjected to chemical copper-plating.

The processing apparatus is not limited to a carbon dioxide gas laser apparatus. A processing machine employing other light sources such as an excimer laser apparatus or YAG laser apparatus may be used. Also, copper electroplating may be conducted instead of copper chemical plating. A metal material other than copper, or a conductive resin can be employed. 784 printed wiring boards of Samples 1–4 of the present invention and 784 printed wiring boards of Comparative Samples 1–4 were produced, each with different thickness T1 for adhesive agent 203 and different thickness T2 for dielectric film 204. The pre-press thickness t1b of adhesive agent 203b constituting adhesive agent 203 were altered in some of the produced printed wiring boards. The capacitive density of the capacitor incorporated in the printed wiring board, the electrostatic capacity variation, and count of occurrence of shorting were obtained. These data are shown in Table 1 set forth below together with respective thickness t1b of adhesive agent 203b prior to a pressing step, thickness T2 of dielectric film 204 in film form, thickness T1 and T2 of the dielectric film located between electrodes, and the ratio of the thickness of adhesive agent 203 to the thickness of the dielectric film located between electrodes.

TABLE 1

| Printed Writing Board | Thickness of Adhesive Agent Layer 203b Prior to Pressing t1b (μm) | Thickness of Dielectric Film 204 in film form T2 (μm) | Thickness of Dielectric Film T1 + T2 (μm) | Ratio of Adhesive Agent 203 Thickness to Dielectric Film Thickness T1/T1 + T2 | Capacitive Density of Capacitor (pF/mm$^2$) | Variation in Electrostatic Capacity (%) | Frequency of Shorting Occurrence |
|---|---|---|---|---|---|---|---|
| Sample 1 | 10 | 6 | 7.0 | 0.14 | 3.8 | 2.0 | 0/784 |
| Sample 2 | 12 | 6 | 8.7 | 0.31 | 3.1 | 3.1 | 0/784 |
| Sample 3 | 15 | 6 | 9.9 | 0.39 | 2.7 | 3.4 | 0/784 |
| Sample 4 | 15 | 6 | 6.9 | 0.14 | 3.9 | 1.9 | 0/784 |
| Comparative Sample 1 | 10 | 0 | 2.0 | ∞ | 16 | 129.5 | 21/784 |
| Comparative Sample 2 | 20 | 0 | 9.8 | ∞ | 3.2 | 10.5 | 0/784 |
| Comparative Sample 3 | 30 | 0 | 20.5 | ∞ | 1.4 | 2.8 | 0/784 |
| Comparative Sample 4 | 20 | 6 | 15.0 | 0.60 | 1.9 | 5.9 | 0/784 |

Dielectric film thickness T1+T2 between electrodes was obtained by the average of respective measurements of the thickness of the dielectric film at the perimeter region and center region of conductor films 202 and 205. Conduction between electrodes were checked using a tester of direct current voltage 1 (V) to identify any presence of short-circuiting. Evaluation of the capacitor capacitive density and variation in electrostatic capacity was conducted on capacitors absent of short-circuiting.

An impedance analyzer was connected to conductor films 202 and 205 to measure the electrostatic capacity of each capacitor using a signal of amplitude 1V at the measurement frequency of 1 (MHz). The electrostatic capacity value was divided by the area of conductor films 202 and 205 obtained by X-ray transmission observation to obtain the capacitive density of a capacitor. Table 1 represents the average of such obtained capacitive densities of the capacitors.

Variation in electrostatic capacity was obtained by deriving the standard deviation from respective measured electrostatic capacity values of wiring boards, multiplying the derived standard deviation value by 3, and dividing that value by the average of the electrostatic capacity of a capacitor.

Referring to Table 1, printed wiring boards of Samples 1–3 had a dielectric film 204 of 6 μm in thickness provided. In contrast, the printed circuit boards of Comparative Samples 1–3 were absent of dielectric film 204. It is appreciated that variation in electrostatic capacity can be suppressed to a low level in printed wiring boards of Samples 1–3 whereas significant variation in electrostatic capacity was observed in printed wiring boards of Comparative Samples 1 and 2. 21 out of 784 capacitors exhibited short-circuiting in the printed wiring board of Comparative Sample 1 that has a thin dielectric film. In view of the foregoing, confirmation was made that the provision of dielectric film 204 in film form is advantageous in that shorting between electrodes is prevented and variation in electrostatic capacity is suppressed.

It is appreciated that the printed wiring board of Comparative Sample 3 had variation in electrostatic capacity suppressed even though dielectric film 204 was not provided. This is probably because of the fact that the dielectric film is thick enough in the printed wiring board of Comparative Sample 3 to be impervious to the presence of asperity at the surface of substrate 201. However, the printed wiring board of Comparative Sample 3 had the capacitive density of the capacitor deteriorated, posing the problem that a capacitor cannot be incorporated in the printed wiring board in high density.

The printed wiring boards of Samples 1–3 had a ratio of thickness T1 of adhesive agent 203 to thickness T1+T2 of the dielectric film set to below 0.4, whereas the printed wiring board of Comparative Sample 4 had a ratio of 0.60, higher than 0.4. As a result, the printed wiring board of Comparative Sample 4 could not have variation in the electrostatic capacity of the capacitor suppressed sufficiently. It was confirmed that variation in electrostatic capacity of a capacitor could be suppressed sufficiently by setting the ratio of thickness T1 of adhesive agent 203 to thickness T1+T2 of dielectric film in the range of 0<T1/(T1+T2)≦0.4.

The printed wiring board of Sample 4 is absent of adhesive agent 203a in contact with conductor film 205, likewise printed wiring board 220 of FIG. 20, and has only adhesive agent 203 in contact with conductor film 202 provided. It was confirmed that a printed wiring board incorporating a capacitor can be realized with variation in electrostatic capacity of a capacitor sufficiently suppressed and occurrence of shorting between electrodes prevented by providing a dielectric film 204 in film form so as to be sufficiently in close contact with conductor film 205.

According to the present invention, a printed wiring board incorporating a capacitor formed with a capacitive density of stable and desirable level and that can reliably prevent shorting between facing electrodes, a semiconductor device including such a printed wiring board, and a fabrication method of such a printed wiring board can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wiring board comprising:
   a first conductor formation substrate including a first substrate having a planar surface, and a plurality of first conductors spaced apart and on said planar surface of said first substrate;
   a second conductor formation substrate including a second substrate, and a plurality of second conductors partially within said second substrate and exposed at a surface of said second substrate, said second conductors and said surface of said second substrate facing said first conductors; and a dielectric interposed between said first and second conductor formation substrates, wherein
at least said dielectric is formed by thermo-compression bonding, and
said dielectric includes
an adherent insulator having a melting point lower than a temperature reached during the thermo-compression bonding of said dielectric, and melts during the thermo-compression bonding, and
a dielectric film interposed between said first and second conductors, having a surface subjected to a treatment to improve wettability by the adherent insulator when melted, and having a melting point higher than the temperature reached during the thermo-compression bonding.

2. The wiring board according to claim 1, wherein
said adherent insulator is interposed only between said dielectric film and said first conductor formation substrate, and
said dielectric film has a face facing said first conductor formation substrate and treated to improve wettability, and a face facing said second conductor formation substrate side and treated to improve adherence to said second conductor.

3. The wiring board according to claim 1, wherein
said first conductors and said second conductors include plate electrodes, and
said first conductors, said second conductors, and a dielectric between said first and second conductors constitute an internal capacitor.

4. The wiring board according to claim 1, wherein
said first and second conductors include a conductor line having a spiral shape, and
said first conductors, said second conductors, and an electrical connection in a through hole in said dielectric, and connecting said first and second conductors electrically, has a winding direction to constitute an internal inductor.

5. The wiring board according to claim 4, wherein
the through hole is formed by laser light, and
said first conductors have a face facing said dielectric and treated to reduce reflectance of the laser light.

6. The wiring board according to claim 1, wherein said dielectric film includes at least a dielectric parent material, and a powder in said parent material, said powder having a dielectric constant higher than the dielectric constant of said parent material.

7. The wiring board according to claim 1, wherein said dielectric film includes a dielectric parent material, and a powder in said parent material, said powder having a magnetic permeability higher than the magnetic permeability of said parent material.

8. The wiring board according to claim 1, wherein said adherent insulator is interposed between pairs of said first conductors.

9. A fabrication method of a wiring board defined in claim 1, comprising:
a first conductor formation substrate step of providing said first conductor on said first substrate to form said first conductor formation substrate;
a first insulation film stacking step of stacking an adherent insulation film having a melting point lower than the temperature reached during said thermo-compression bonding on said first conductor formation substrate at said first conductor side;
a dielectric film processing step of subjecting said dielectric film to a treatment to improve said wettability;
a dielectric film stacking step of stacking said dielectric film on said adherent insulation film;
a second insulation film stacking step of stacking said adherent insulation film having a melting point lower than the temperature reached during said thermo-compression bonding on said dielectric film, after said dielectric film stacking step;
a conductor film stacking step of providing a conductor film in film form at said adherent insulation film stacked in said second insulation film stacking step;
a thermo-compression bonding step of rendering said adherent insulation film molten by said thermo-compression bonding and compressing said first conductor and said conductor film in a direction approaching each other;
a second conductor formation step of forming said conductor film on said dielectric film as a plurality of said second conductors; and
a second conductor formation substrate step of covering said second conductor with said second substrate to form said second conductor formation substrate,
wherein, in said thermo-compression bonding step, said adherent insulation film is extruded respectively, with said dielectric film sagging, from a region between said first conductor and said dielectric film and between said conductor film facing said first conductor and said dielectric film to be formed as said adherent insulator, and said dielectric is formed by said dielectric film and said adherent insulator.

10. The fabrication method of a wiring board according to claim 9, wherein a total of a thickness of said adherent insulation film stacked in said first insulation film stacking step on and a thickness of said adherent insulation film stacked in said second insulation film stacking step is set smaller than a thickness of said first conductor.

11. The fabrication method of a wiring board according to claim 2, comprising:
a first conductor formation substrate step of providing said first conductor on said first substrate to form said first conductor formation substrate;
a first insulation film stacking step of stacking an adherent insulation film having a melting point lower than the temperature reached during said thermo-compression bonding on said first conductor formation substrate at said first conductor side;
a dielectric film processing step of subjecting one face of said dielectric film to a treatment to improve said wettability, and the other face of said dielectric film to a treatment to improve said adherence;
a dielectric film stacking step of stacking said dielectric film on said adherent insulation film with said one face towards said adherent insulation film;
a conductor stacking step of providing a conductor film at said other face of said dielectric film;
a thermo-compression bonding step of rendering said adherent insulation film molten by said thermo-compression bonding, and pressing said first conductor and said conductor film in a direction approaching each other;
a second conductor formation step of forming said conductor film on said dielectric film as said second conductor; and a second conductor formation substrate step of covering said second conductor with said second substrate to form said second conductor formation substrate, said adherent insulation film extruded from a region between said first electrode and said dielectric film to be formed as said adherent insulator in said thermo-compression bonding step, said dielectric film and said adherent insulator constituting said dielectric.

12. The fabrication method of a wiring board according to claim 11, wherein said adherent insulation film has a thickness smaller than the thickness of said first conductor.

13. A fabrication method of a wiring board defined in claim 5, said fabrication method comprising:

- a first conductor formation substrate step of providing said first conductor on said first substrate to form said first conductor formation substrate;
- a first insulation film stacking step of stacking an adherent insulation film having a melting point lower than the temperature reached during said thermo-compression bonding on said first conductor formation substrate at said first conductor side;
- a dielectric film processing step of subjecting said dielectric film to a treatment to improve said wettability;
- a dielectric film stacking step of stacking said dielectric film on said adherent insulation film;
- a second insulation film stacking step of stacking said adherent insulation film having a melting point lower than the temperature reached during said thermo-compression bonding on said dielectric film, after said dielectric film stacking step;
- a conductor film stacking step of providing a conductor film in film form at said adherent insulation film stacked in said second insulation film stacking step;
- a thermo-compression bonding step of rendering said adherent insulation film molten by said thermo-compression bonding and pressing said first conductor and said conductor film in a direction approaching each other;
- a second conductor formation step of forming said conductor film on said dielectric film as a plurality of said second conductors; and
- a second conductor formation substrate step of covering said second conductor with said second substrate to form said second conductor formation substrate, said adherent insulation film extruded respectively, with said dielectric film sagging, from a region between said first conductor and said dielectric film and between said conductor film facing said first conductor and said dielectric film to be formed as said adherent insulator, in said thermo-compression bonding step, said dielectric film and said adherent insulator constituting said dielectric, said fabrication method further comprising a first conductor processing step of subjecting a surface of said first conductor to a treatment to reduce reflectance of said laser;

- a through hole formation step of directing said laser towards a surface of said first conductor to form said through hole, prior to said second conductor formation substrate step; and
- an electrical connecting step of forming said electrical connection between said first conductor and said second conductor through said through hole to establish electrical connection between said first and second conductors.

* * * * *